(12) United States Patent
Kawano et al.

(10) Patent No.: US 9,142,479 B2
(45) Date of Patent: Sep. 22, 2015

(54) ELECTRONIC DEVICE AND SEMICONDUCTOR DEVICE

(71) Applicant: RENESAS ELECTRONICS CORPORATION, Kanagawa (JP)

(72) Inventors: Kenya Kawano, Hitachinaka (JP); Hiroyuki Nakamura, Kanagawa (JP); Yukihiro Sato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/973,077

(22) Filed: Aug. 22, 2013

(65) Prior Publication Data

US 2014/0061821 A1 Mar. 6, 2014

(30) Foreign Application Priority Data

Sep. 5, 2012 (JP) ................................. 2012-194811

(51) Int. Cl.
| | |
|---|---|
| *H01L 23/373* | (2006.01) |
| *H01L 29/772* | (2006.01) |
| *H01L 29/78* | (2006.01) |
| *H01L 23/495* | (2006.01) |
| *H01L 23/00* | (2006.01) |

(52) U.S. Cl.
CPC ........ *H01L 23/373* (2013.01); *H01L 23/49548* (2013.01); *H01L 23/49551* (2013.01); *H01L 23/49568* (2013.01); *H01L 23/49575* (2013.01); *H01L 23/49582* (2013.01); *H01L 24/73* (2013.01); *H01L 29/772* (2013.01); *H01L 23/49513* (2013.01); *H01L 23/49537* (2013.01); *H01L 24/29* (2013.01); *H01L 24/32* (2013.01); *H01L 24/37* (2013.01); *H01L 24/40* (2013.01); *H01L 24/45* (2013.01); *H01L 24/48* (2013.01); *H01L 24/83* (2013.01); *H01L 24/84* (2013.01); *H01L 29/7813* (2013.01); *H01L 2224/29101* (2013.01); *H01L 2224/29339* (2013.01); *H01L 2224/32245* (2013.01); *H01L 2224/371* (2013.01); *H01L 2224/37013* (2013.01); *H01L 2224/37124* (2013.01);

(Continued)

(58) Field of Classification Search
CPC ................. H01L 2924/00; H01L 2224/73265; H01L 2224/48247; H01L 2924/00014
USPC ................. 257/666, 787, 686, 678, 784, 690; 438/123, 106, 108, 127, 613
See application file for complete search history.

(56) References Cited

U.S. PATENT DOCUMENTS 5,157,480 A * 10/1992 McShane et al. ............. 257/693
6,181,002 B1 * 1/2001 Juso et al. ..................... 257/686

(Continued)

FOREIGN PATENT DOCUMENTS

JP 2001-127228 A 5/2001

*Primary Examiner* — Zandra Smith
*Assistant Examiner* — Jaehwan Oh
(74) *Attorney, Agent, or Firm* — Mattingly & Malur, PC

(57) ABSTRACT

Provided is an electronic device having a semiconductor device and a mounting board. The semiconductor device has a die pad, a semiconductor chip on the die pad, a coupling member coupling the die pad to the semiconductor chip, and a semiconductor package member covering the upper portion of the semiconductor chip and the side surface of the die pad. In this semiconductor device, the plane area of the coupling member coupling the mounting board to the die pad is smaller than the plane area of the lower surface of the die pad exposed from the semiconductor package material. This makes it possible to reduce separation between the die pad and the semiconductor chip resulting from cracks, due to temperature cycling, of the coupling member present between the die pad and the semiconductor chip.

17 Claims, 20 Drawing Sheets

(52) U.S. Cl.
CPC ............... *H01L 2224/37147* (2013.01); *H01L 2224/40245* (2013.01); *H01L 2224/45124* (2013.01); *H01L 2224/45144* (2013.01); *H01L 2224/45147* (2013.01); *H01L 2224/48091* (2013.01); *H01L 2224/48137* (2013.01); *H01L 2224/48247* (2013.01); *H01L 2224/73221* (2013.01); *H01L 2224/73263* (2013.01); *H01L 2224/73265* (2013.01); *H01L 2224/84801* (2013.01); *H01L 2924/014* (2013.01); *H01L 2924/1305* (2013.01); *H01L 2924/13091* (2013.01); *H01L 2924/15747* (2013.01); *H01L 2924/18301* (2013.01); *H01L 2924/3511* (2013.01)

(56) References Cited

U.S. PATENT DOCUMENTS

| | | | | |
|---|---|---|---|---|
| 6,396,129 | B1* | 5/2002 | Hung et al. | 257/666 |
| 6,737,737 | B1* | 5/2004 | Chang et al. | 257/676 |
| 8,008,758 | B1* | 8/2011 | Kim et al. | 257/676 |
| 2002/0011654 | A1* | 1/2002 | Kimura | 257/686 |
| 2003/0047754 | A1* | 3/2003 | Hsu et al. | 257/200 |
| 2003/0141575 | A1* | 7/2003 | Yu et al. | 257/666 |
| 2003/0197262 | A1* | 10/2003 | Huang et al. | 257/686 |
| 2004/0099931 | A1* | 5/2004 | Huang et al. | 257/666 |
| 2007/0111395 | A1* | 5/2007 | Tsai et al. | 438/123 |
| 2007/0228534 | A1* | 10/2007 | Uno et al. | 257/678 |
| 2013/0154123 | A1* | 6/2013 | Poh et al. | 257/782 |

* cited by examiner

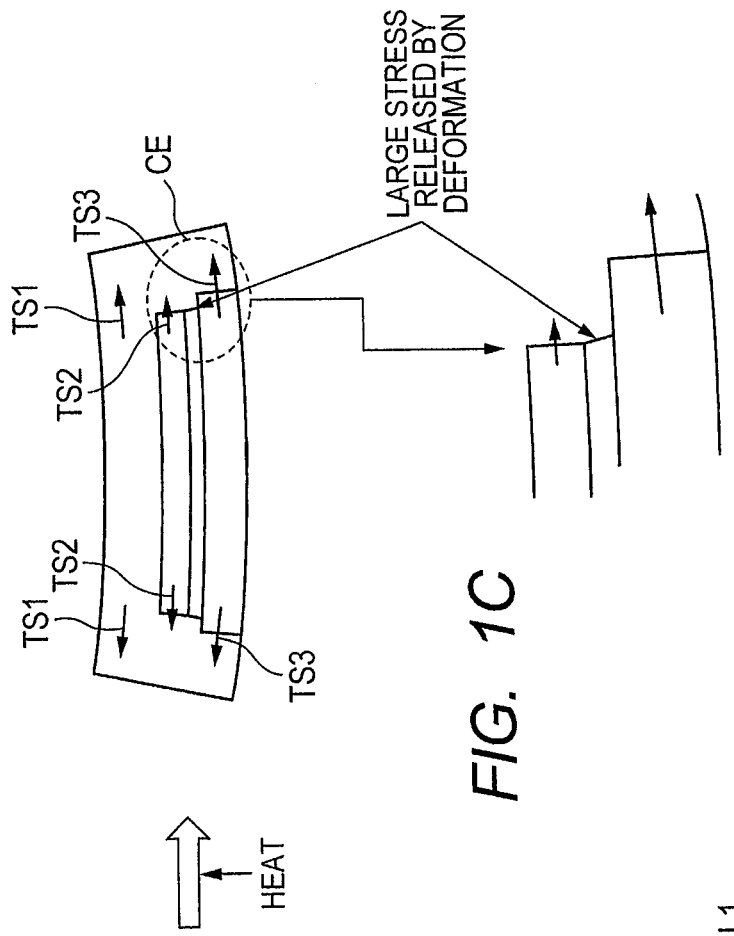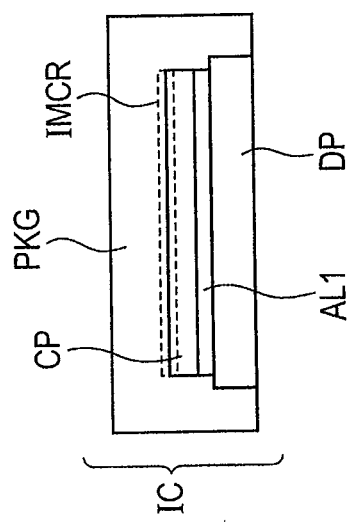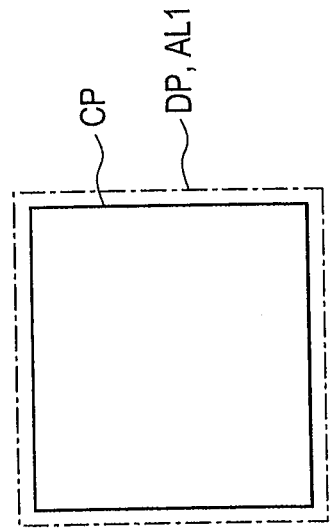

FIG. 2

| | LINEAR EXPANSION COEFFICIENT (ppm/K) | FLEXURAL RIGIDITY (MPa·mm$^4$) | MATERIAL |
|---|---|---|---|
| MOUNTING BOARD MB | $\alpha_{MB} = 18$ | $K_{MB} = 285 \times 10^3$ | EPOXY RESIN |
| DIE PAD DP | $\alpha_{DP} = 18$ | $K_{DP} = 9.2 \times 10^3$ | COPPER |
| SEMICONDUCTOR CHIP CP | $\alpha_{CP} = 3$ | $K_{CP} = 4.6 \times 10^3$ | SILICON CRYSTAL |
| SEMICONDUCTOR PACKAGE MEMBER PKG | $\alpha_{PKG} = 12$ TO $15$ | $K_{PKG} = 32.2 \times 10^3$ | RESIN |
| SEMICONDUCTOR DEVICE IC | / | $K_{IC} = 46 \times 10^3 (= K_{DP} + K_{CP} + K_{PKG})$ | / |

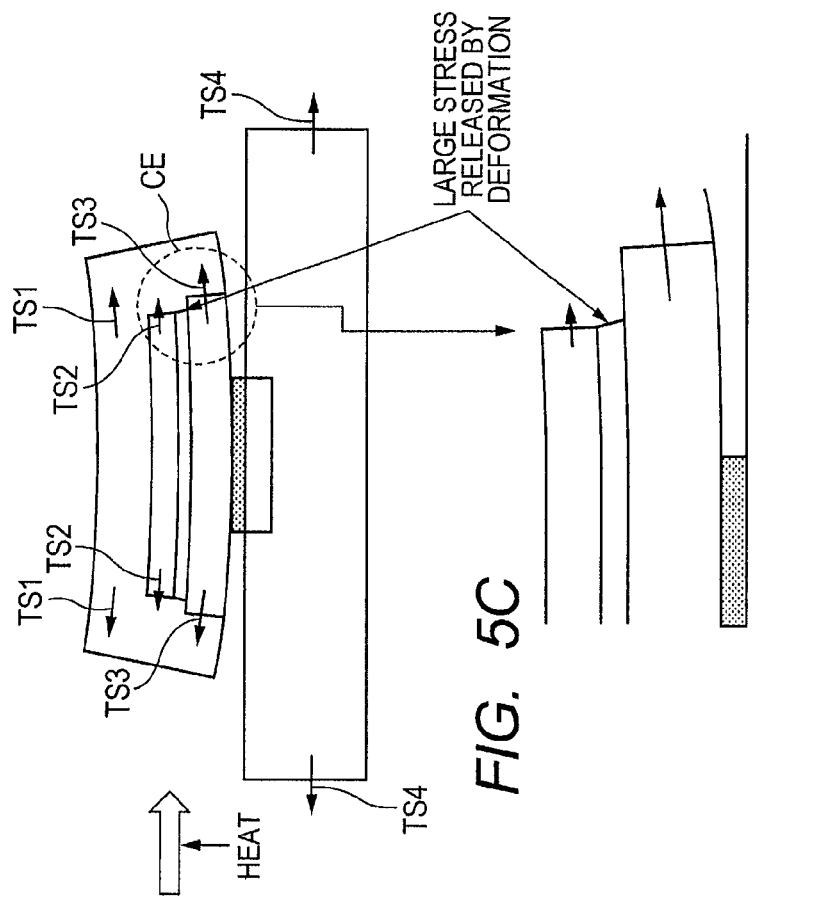
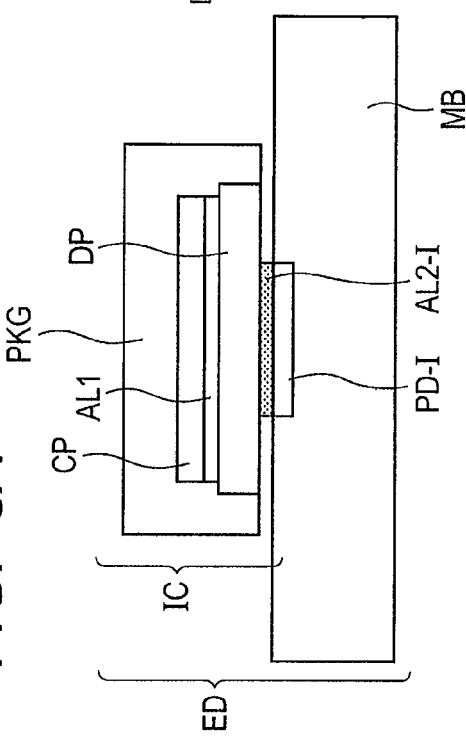
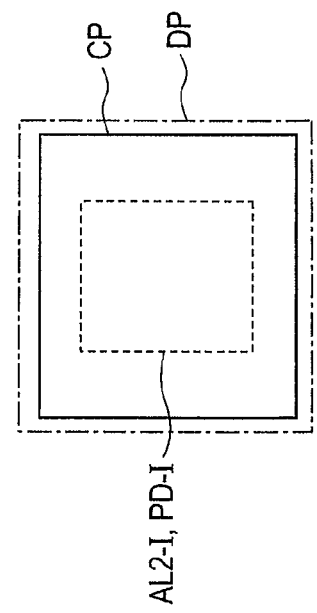

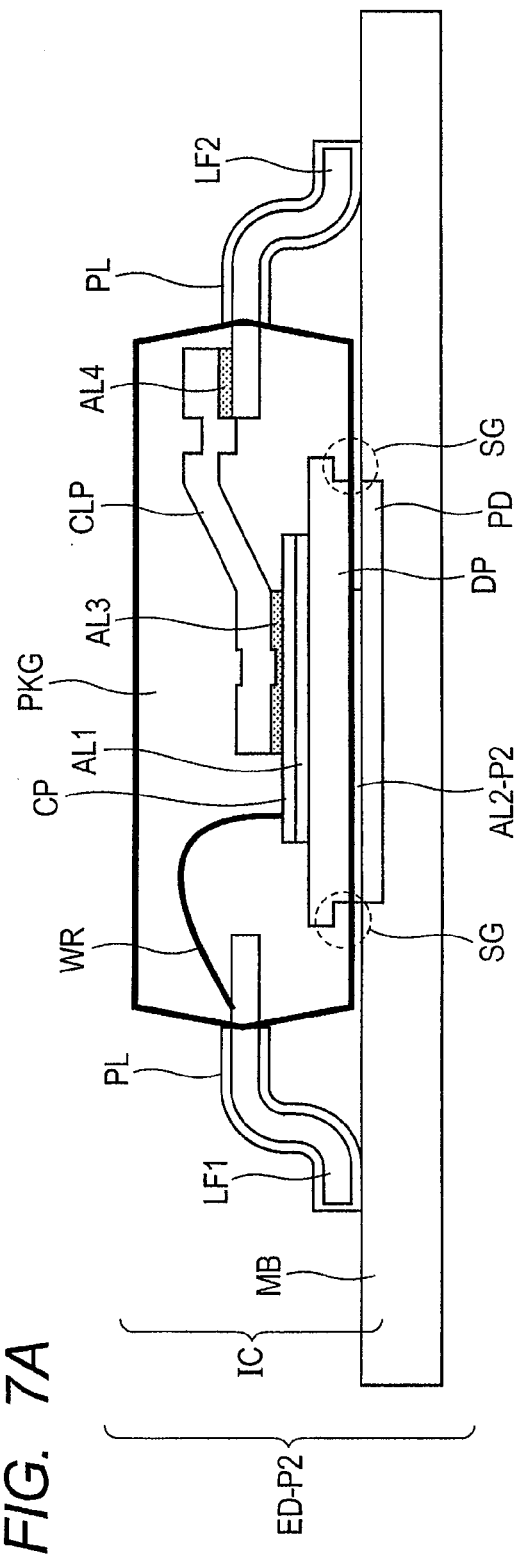
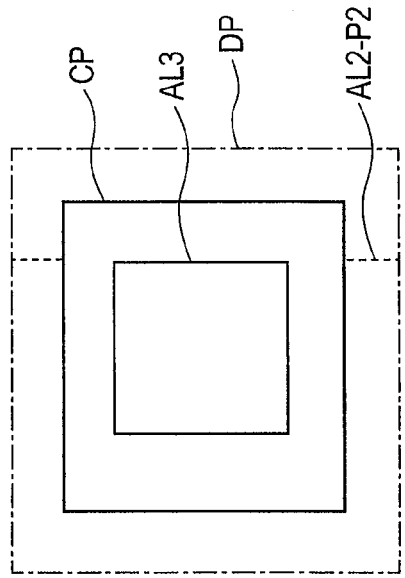
FIG. 7A
FIG. 7B

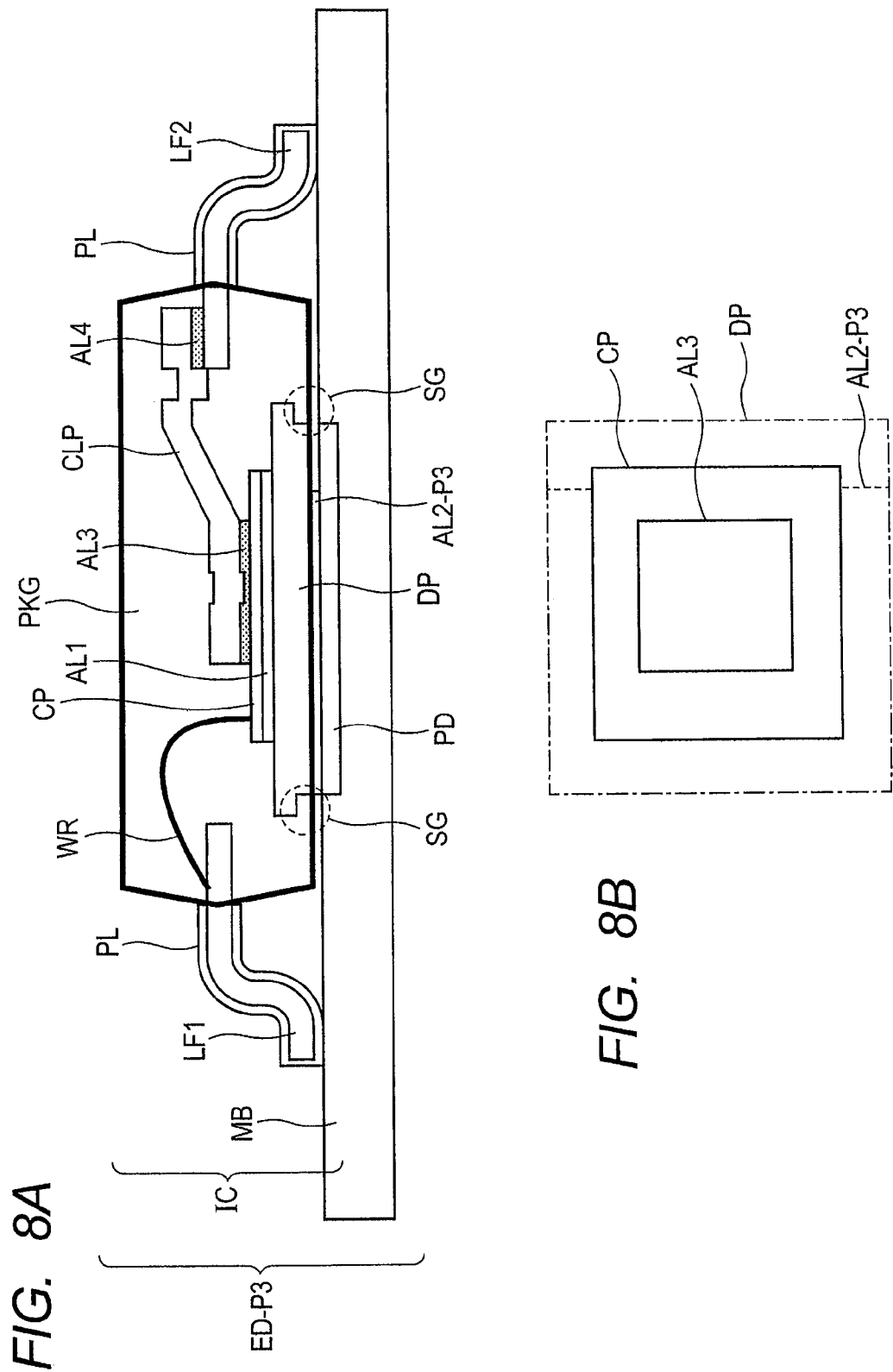

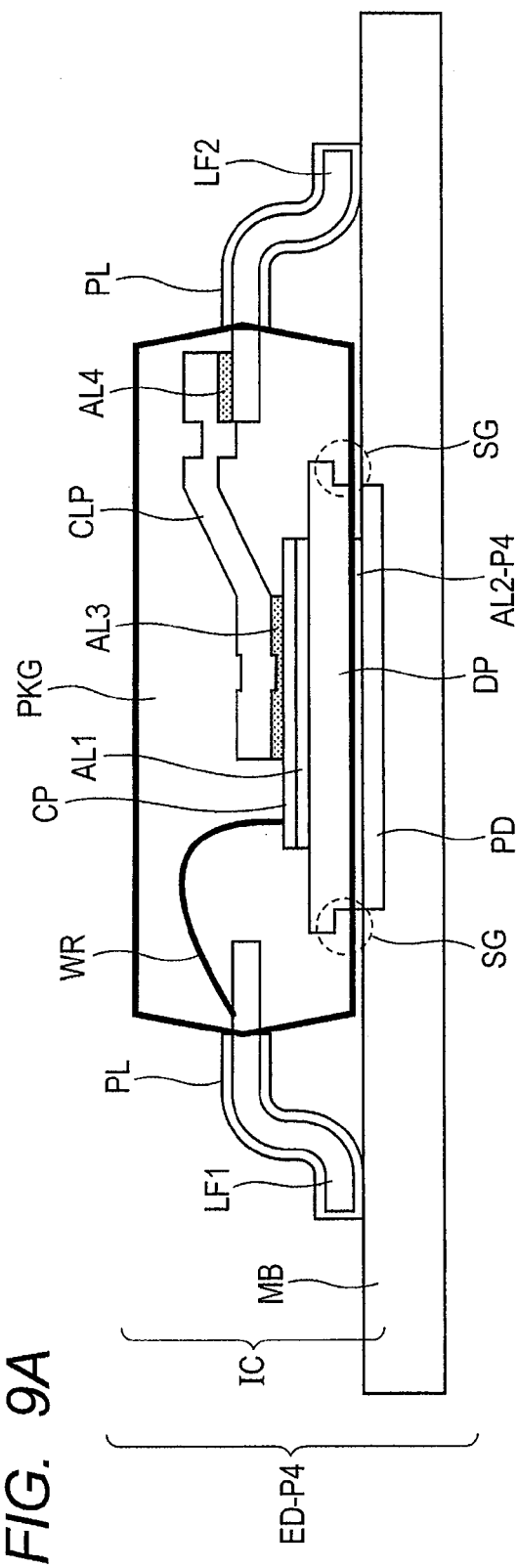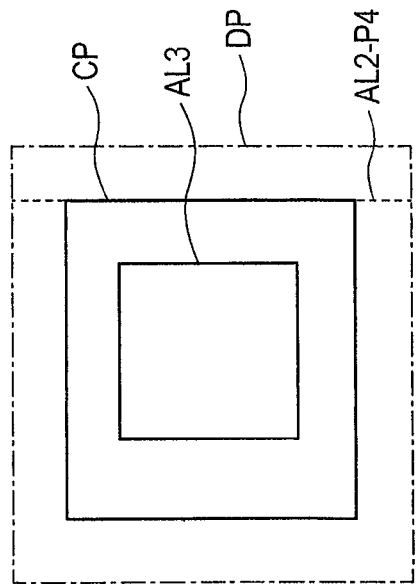

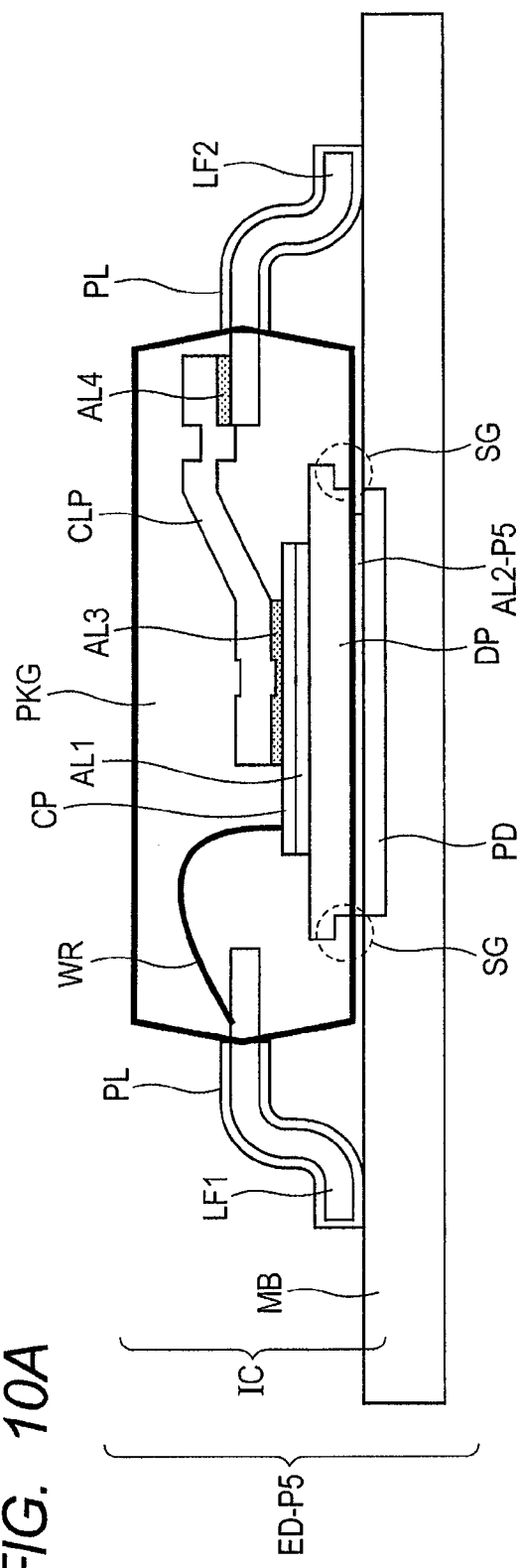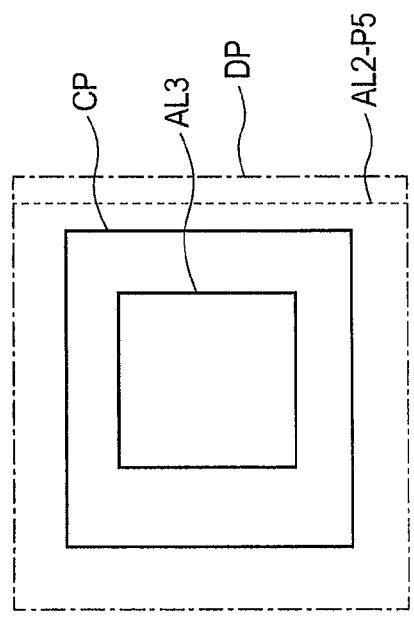

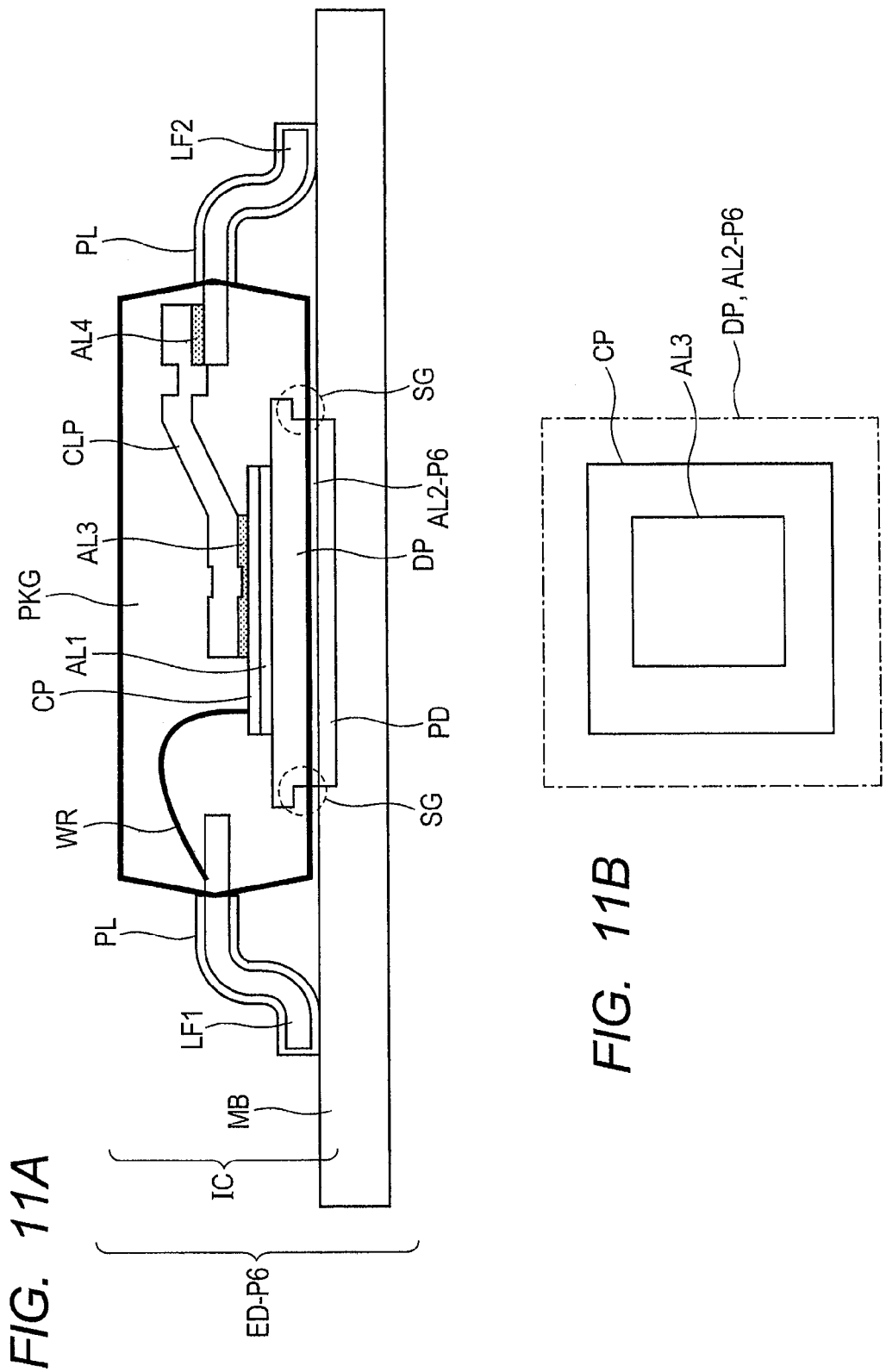

THERMAL RESISTANCE DEPENDENCE ON DIE PAD COUPLING AREA

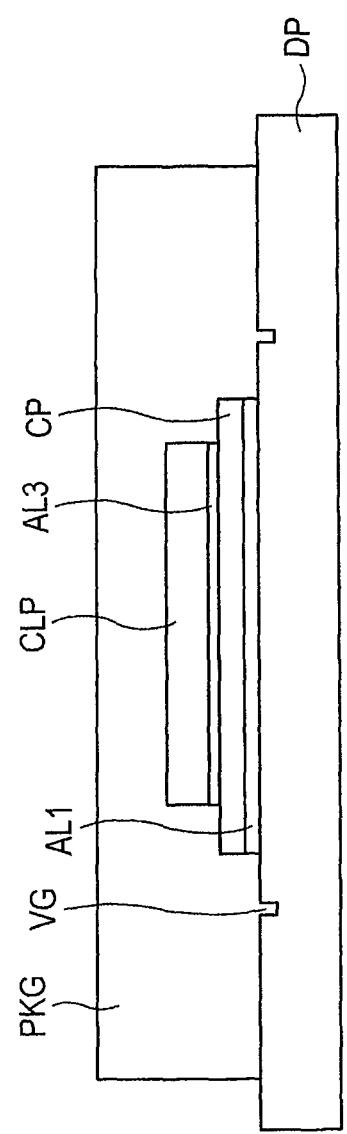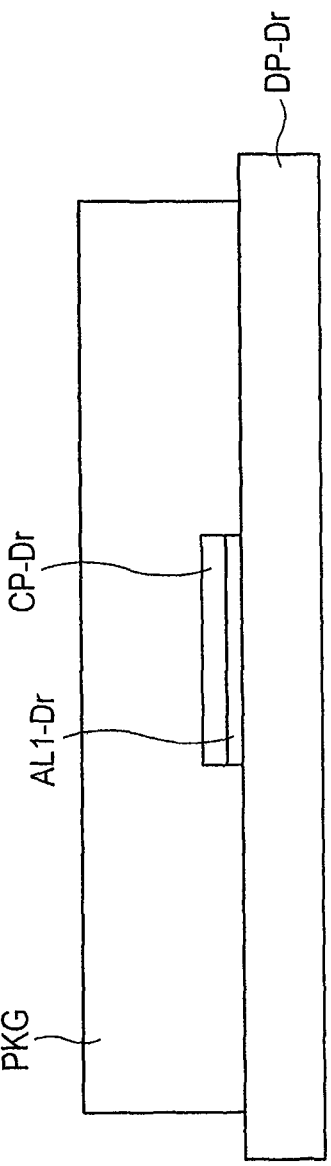
FIG. 18A
FIG. 18B

ELECTRONIC DEVICE AND SEMICONDUCTOR DEVICE

CROSS-REFERENCE TO RELATED APPLICATIONS

The disclosure of Japanese Patent Application No. 2012-194811 filed on Sep. 5, 2012 including the specification, drawings and abstract is incorporated herein by reference in its entirety.

BACKGROUND

The present invention relates to an electronic device, for example, a technology applicable to a semiconductor device having a power transistor and an electronic device having the semiconductor device.

A semiconductor device is sometimes mounted on a mounting board by exposing a die pad from a semiconductor package member of the semiconductor device and coupling the entire lower surface of the exposed die pad to a pad of the mounting board. A large adhesive force is secured by coupling the entire lower surface of the die pad to the pad of the mounting board. The area of the pad of the mounting board is therefore made a little greater than the area of the entire lower surface of the die pad. In particular, when the semiconductor device includes a semiconductor chip having a power MOSFET or the like that generates heat greatly upon use, the heat radiation property is secured by releasing the heat thus generated upon use through a joint between the entire bottom surface of the die pad and the pad of the mounting board greater than the semiconductor chip.

As a result of the related art search after completion of the present invention, Japanese Patent Laid-Open No. 2001-127228 (Patent Document 1) was found as a related art. An object of Patent Document 1 is to realize a power type resin molded semiconductor device while reducing the size of the semiconductor device and increasing the number of terminals. A means for satisfying the above-mentioned object is disclosed as follows (refer to FIGS. 7A and 7B of Patent Document 1). A resin film (3) has thereon a die pad (4) and a plurality of signal coupling leads (5) that surround the die pad. The die pad (4) has thereon a semiconductor chip (11) via an adhesive (12) and at the same time, the semiconductor chip (11) and each of the signal coupling leads (5) are coupled to each other with a fine metal wire (13). On the upper surface side of the resin film (3), the resin film (3), the die pad (4), the signal coupling leads (5), the semiconductor chip (11), the metal wire (13), and the like are molded with a resin package (14). The die pad (4) is equipped with a heat radiation portion (4a) protruding below the resin film (3), while each of the signal coupling leads (5) is equipped with a terminal land portion (6) protruding below the resin film (3). Since the die pad (4) is smaller than the semiconductor chip (11), the semiconductor chip (1) may be equipped with the terminal land portion (6) therebelow. The numbers in the parentheses are those described in Patent Document 1.

Patent Document 1

Japanese Patent Laid-Open No. 2001-127228

SUMMARY

The present inventors have found the following problem. Described specifically, when a semiconductor device is mounted on a mounting board as described in the first paragraph of the related art, a coupling material for binding a semiconductor chip to a die pad is damaged due to an increase in internal stress caused by suppression of temperature-change dependent deformation of the semiconductor device.

Another problem and novel features will be apparent from the description herein and accompanying drawings.

In an electronic device according to one embodiment, the plane area of a coupling member coupling a mounting board to a die pad is smaller than the plane area of the lower surface of the die pad exposed from a molding body of a semiconductor device. This semiconductor device has the die pad, a semiconductor chip on the die pad, the coupling material coupling the die pad to the semiconductor chip, and the molding body that covers the upper portion of the semiconductor chip and the side surface of the die pad. The lower surface of the die pad is exposed from the molding body. The semiconductor device is coupled to the mounting board via a coupling material below the die pad.

According to the above-mentioned embodiment, occurrence of a temperature-change-dependent trouble at a joint between the semiconductor chip and the die pad can be reduced.

BRIEF DESCRIPTION OF THE DRAWINGS

FIGS. 1A, 1B, 1C, and 1D show a thermal stress that occurs in a semiconductor device when the semiconductor device is subjected to a temperature cycling test;

FIG. 2 shows the relationship between constituent elements of the electronic device and their linear expansion coefficient, flexural rigidity, and material;

FIGS. 5A, 5B, 5C, and 5D include a cross-sectional view of an electronic device according to First Embodiment and a diagram showing a thermal stress that occurs in this electronic device when the device is subjected to a temperature cycling test;

FIGS. 7A and 7B are a cross-sectional view and a plan view showing a second mode (coupling pattern 2) of a second coupling member of an electronic device, respectively;

FIGS. 8A and 8B are a cross-sectional view and a plan view showing a third mode (coupling pattern 3) of a second coupling member of an electronic device, respectively;

FIGS. 9A and 9B are a cross-sectional view and a plan view showing a fourth mode (coupling pattern 4) of a second coupling member of an electronic device, respectively;

FIGS. 10A and 10B are a cross-sectional view and a plan view showing a fifth mode (coupling pattern 5) of a second coupling member of an electronic device, respectively;

FIGS. 11A and 11B are a cross-sectional view and a plan view showing a sixth mode (coupling pattern 6) of a second coupling member of an electronic device, respectively;

FIGS. 18A and 18B are cross-sectional views of the semiconductor device;

DETAILED DESCRIPTION

Figure 3A:
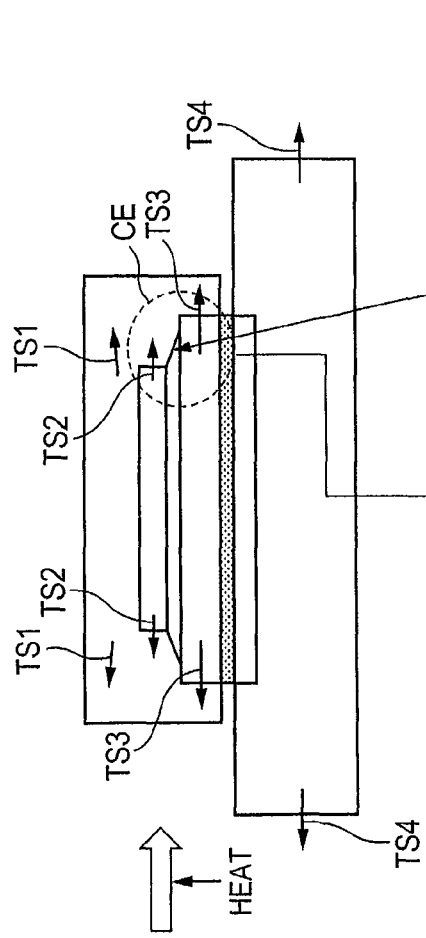
FIGS. 3A, 3B, 3C, and 3D show a thermal stress that occurs in a semiconductor device and a mounting board when the semiconductor device is subjected to a temperature cycling test while being mounted on the mounting board.

First, the present inventors made an investigation on a thermal stress that occurs in a semiconductor device in a temperature cycling test without mounting the semiconductor device on a mounting board.

FIGS. 1A, 1B, 1C, and 1D show a thermal stress that occurs in a semiconductor device when the semiconductor device is subjected to a temperature cycling test.

As shown in FIG. 1A, a semiconductor device IC has a die pad DP and a semiconductor chip CP placed on the die pad DP. The die pad DP and the semiconductor chip CP are coupled to each other with a first coupling member AL1. The semiconductor device IC further has a semiconductor package member (which may also be called "molding body" hereinafter) that covers the upper surface of the semiconductor chip CP and the side surface of each of the semiconductor chip CP and the die pad DP. As shown in FIGS. 1A and 1D, the die pad DP is greater than the semiconductor chip CP.

The semiconductor device IC not mounted on a mounting board is subjected to a temperature cycling test. At this temperature cycling test, a temperature applied to the device is changed so that it fluctuates within a range of from 110° to −30° C. Although the temperature condition in the temperature cycling test is not limited to the above-mentioned range, temperatures exceeding the glass transition temperature of the semiconductor package member PKG are not permitted.

Examples of the respective materials to be used for the die pad DP, semiconductor chip CP, semiconductor package member PKG, and semiconductor device IC and physical properties (linear expansion coefficient and flexural rigidity) of them are as shown in FIG. 2. The flexural rigidity $K_{IC}$ of the semiconductor device IC is represented by the sum of the flexural rigidity $K_{DP}$ of the die pad DP, the flexural rigidity $K_{CP}$ of the semiconductor chip CP and the flexural rigidity $K_{PKG}$ of the semiconductor package member PKG. It is to be noted that the mounting board MB is one of constituent elements of the electronic device ED-T shown in FIGS. 3A to 3D.

The present inventors thought that a thermal stress occurred inside the semiconductor device IC as shown in FIG. 1B as a result of a temperature cycling test. As shown by the arrow in this drawing, a thermal stress TS3 occurs in the die pad DP in a direction from the center of the die pad DP toward the outside thereof; a thermal stress TS2 occurs in the semiconductor chip CP in a direction from the center of the semiconductor chip CP toward the outside thereof; and a thermal tress TS1 occurs in the semiconductor package member PKG from the center of the semiconductor package member PKG to the outside thereof.

(1) Here, an attention is paid to a force to be applied to a first coupling member AL1. FIG. 2 shows that the linear expansion coefficient $\alpha_{DP}$ of the die pad DP is greater than the linear expansion coefficient $\alpha_{CP}$ of the semiconductor chip CP so that the thermal stress TS3 that occurs in the die pad DP becomes greater than the thermal stress TS2 that occurs in the semiconductor chip CP. As a result, in the first coupling member AL1 in the vicinity of a chip edge CE which is a region at the end of the semiconductor chip CP, a stress that tries to widen from the center of the semiconductor device IC to the outside thereof is applied more greatly to a joint between the first coupling member AL1 and the die pad DP than to a joint between the first coupling member AL1 and the semiconductor chip CP. In order to suppress stretching of the first coupling member AL1 in the vicinity of the chip edge CE due to this difference in the stress that tries to widen, there occurs, in the semiconductor device IC, a bending force (a force to warp toward the upper side) so that the die pad DP widens more than the semiconductor chip CP. Due to this bending force, a stress to be applied to the first coupling member AL1 in the vicinity of the chip edge CE is relaxed (released).

(2) Next, an attention is paid to a force to be applied to a joint between the semiconductor chip CP and the semiconductor package member PKG. It is apparent from FIG. 2 that the linear expansion coefficient $\alpha_{PKG}$ of the semiconductor package material is greater than the linear expansion coefficient $\alpha_{CP}$ of the semiconductor chip CP. The thermal stress TS1 that occurs in the semiconductor package member PKG therefore becomes greater than the thermal stress TS2 that occurs in the semiconductor chip CP. Here, an intermediate contact region IMCR is assumed between the semiconductor chip CP and the semiconductor package member PKG. The intermediate contact region IMCR is a region including a portion of the semiconductor chip CP and a portion of the semiconductor package member PKG with a contact surface between the semiconductor chip CP and the semiconductor package member PKG being sandwiched between these portions and it is a region of the semiconductor chip CP and the semiconductor package member PKG in the vicinity of the contact surface. In the first coupling member AL1 in the vicinity of the chip edge CE, a stress that is applied to a joint between the intermediate contact region IMCR and the semiconductor chip CP and tries to widen from the center of the semiconductor device IC to the outside thereof is greater than a stress that is applied to a joint between the intermediate contact region IMCR and the semiconductor package member PKG and tries to widen from the center of the semiconductor device IC to the outside thereof. In order to suppress stretching of the intermediate contact region IMCR in the vicinity of the chip edge CE due to this difference in the stress that tries to widen, there occurs, in the semiconductor device IC, a bending force (force warping toward the lower side) so that the semiconductor package member PKG widens more than the semiconductor chip CP. Due to this bending force, a stress to be applied to the intermediate contact region IMCR in the vicinity of the chip edge CE is relaxed (released).

The direction of the bending force (1) is opposite to the direction of the bending force (2). The linear expansion coefficient $\alpha_{DP}$ of the die pad DP is greater than the linear expansion coefficient $\alpha_{PKG}$ of the semiconductor package member PKG so that the thermal stress TS3 that occurs in the die pad DP becomes greater than the thermal stress TS1 that occurs in the semiconductor package member PKG. As a result, there occurs a bending force in the semiconductor device IC to widen the die pad DP more than the semiconductor package member PKG. As shown in FIG. 1C, this bending force deforms the semiconductor device IC, which relaxes, to some extent, the stress to be applied to the first coupling member AL1 in the vicinity of the chip edge CE. Temperature cycling therefore reduces the frequency of damages such as cracks that occur in the first coupling member AL1, leading to a reduction in occurrence of troubles such as separation between the semiconductor chip CP and the die pad DP.

The stress to be applied to the intermediate contact region IMCR in the vicinity of the chip edge CE increases more due to this bending force. However, the semiconductor package member PKG is placed so as to cover not only the upper surface of the semiconductor chip CP but also the side surface of the semiconductor chip CP or the die pad DP. Therefore, the adhesive force between the semiconductor chip CP and the semiconductor package member PKG is presumed to be high in the intermediate contact region IMCR, making it difficult to cause troubles such as damages including cracks in the intermediate contact region IMCR and troubles such as separation between the semiconductor chip CP and the die pad DP even if a stress is large to some extent.

FIGS. 3A, 3B, 3C, and 3D show a thermal stress that occurs in a semiconductor device and a mounting board when a temperature cycling test is conducted with the semiconductor device being mounted on the mounting board.

As shown in FIG. 3A, an electronic device ED-T has, in addition to a semiconductor device IC, a mounting board MB and a second coupling member AL2 coupling the mounting board MB to the semiconductor device IC. The plane area of a portion of the second coupling member AL2 in contact with the die pad DP is equal to the plane area of a portion of the die pad DP exposed from a semiconductor package member PKG.

This electronic device ED-T is subjected to a temperature cycling test. As in the case of FIGS. 1A to 1D, a temperature applied to the device is changed so that it fluctuates within a range of from 110° C. to −30° C. Although the temperature condition is not limited to the above-mentioned range, temperatures exceeding the glass transition temperature of the semiconductor package member PKG are not permitted. Moreover, as in the case of FIGS. 1A to 1D, examples of the material of the mounting board MB, die pad DP, semiconductor chip CP, semiconductor package member PKG, and semiconductor device IC and physical properties thereof (linear expansion coefficient and flexural rigidity) are as shown in FIG. 2.

Figure 3B:
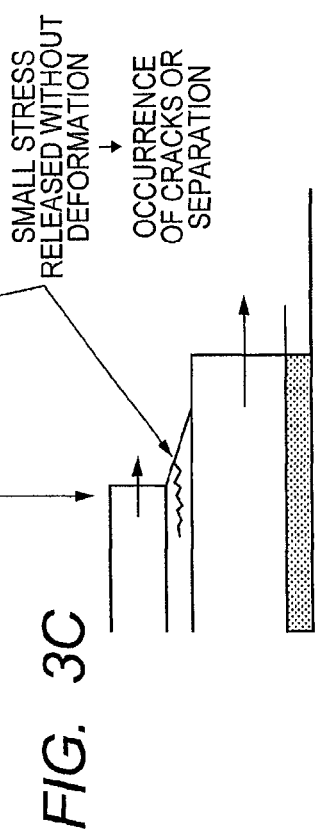

The present inventors thought based on the results of the temperature cycling test that a thermal stress occurs inside the semiconductor device IC as shown in FIG. 3B. As arrows in this drawing suggest, in addition to thermal stresses TS1, TS2, and TS3, a thermal stress TS4 occurs in the mounting board MB in a direction from the center of the mounting board MB to the outside thereof.

Figure 3C:
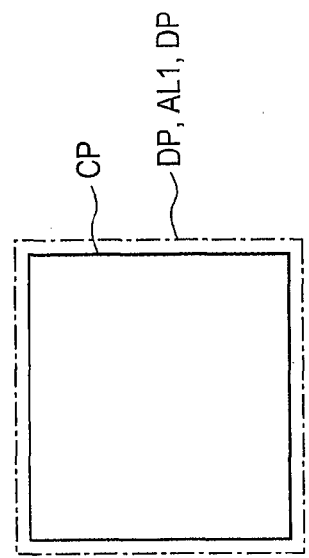
Figure 3D:
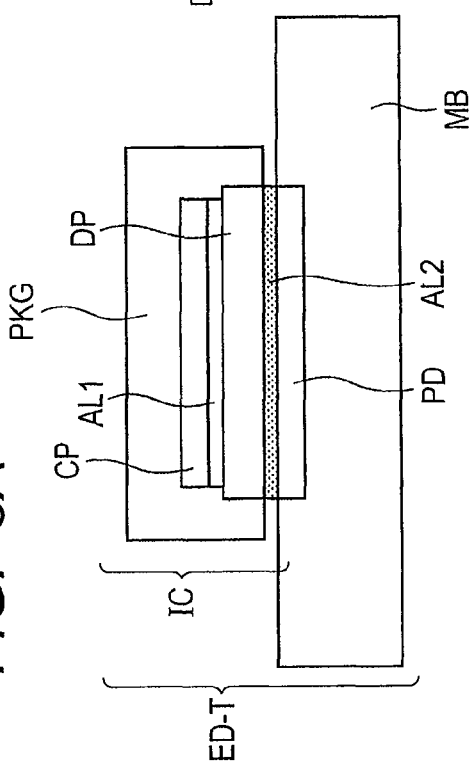

The above-mentioned forces (1) and (2) as described in FIGS. 1A to 1D occur. This suggests that when the semiconductor device IC is not mounted on a mounting board, the temperature cycling test may cause, in the semiconductor device IC, a bending force that widens the die pad DP more than the semiconductor package member PKG. As shown in FIG. 2, however, the flexural rigidity $K_{IC}$ of the semiconductor device IC is smaller than the flexural rigidity $K_{MB}$ of the mounting board MB. Moreover, as shown in FIGS. 3A and 3D, a plane area of a portion of the second coupling member AL2 in contact with the die pad DP is equal to the plane area of a portion of the die pad DP exposed from the semiconductor package member PKG so that the semiconductor device IC and the mounting board MB are coupled to each other with a wide plane area. The deformation of the semiconductor device IC is therefore inhibited by the mounting board MB. As a result, deformation of the electronic device DE-T hardly occurs even by this bending force because of the high flexural rigidity $K_{MB}$ and bending of the semiconductor device IC as shown in FIGS. 1A to 1D hardly occurs. As shown in FIG. 3C, therefore, a stress to be applied to the first coupling member AL1 in the vicinity of the chip edge CE is scarcely relaxed, damages (troubles) such as cracks occur in the first coupling member AL1 as a result of temperature cycling, and troubles such as separation between the semiconductor chip CP and the die pad DP occur. It is to be noted that the plane area of the pad PD is greater than the plane area of the die pad DP.

Figure 4:
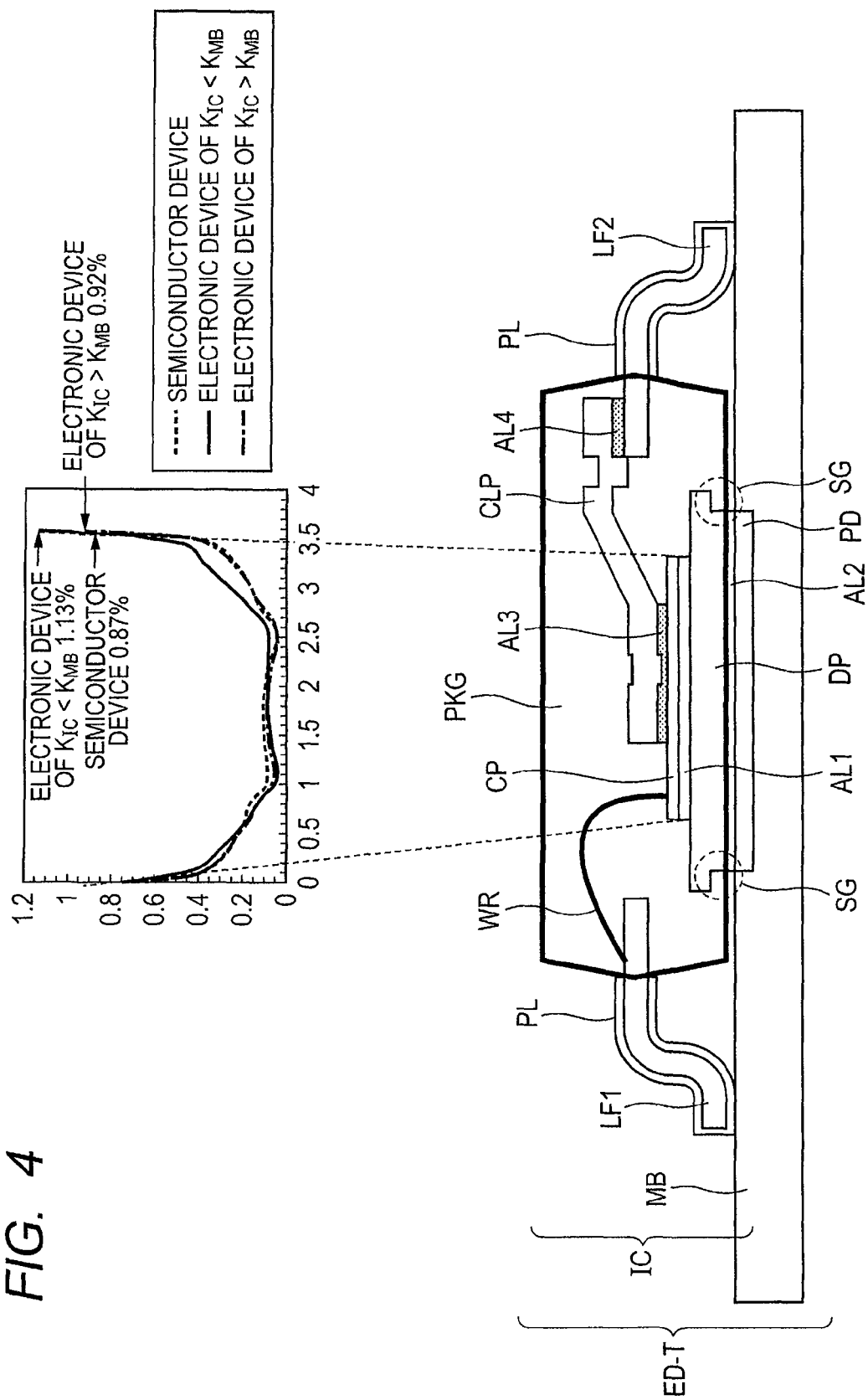
FIG. 4 shows the results of analysis on what strain has occurred in a first coupling member of an electronic device as shown in FIG. 3A.

FIG. 4 shows the results of analysis on what strain has occurred in a first coupling member AL1 of the electronic device as shown in FIG. 3A. FIG. 4 includes a graph of a plastic strain on the upper side and a cross-sectional view of the electronic device on the lower side.

The following are constituent elements omitted from FIGS. 1A to 1D or FIGS. 3A to 3D. The constituent elements described below are omitted because they have less influence on the linear expansion coefficient or flexural rigidity than the mounting board MB, die pad DP, semiconductor chip CP, and semiconductor package member PKG. A stress that occurs in the semiconductor device IC or electronic device ED-T is considered in FIGS. 1 to 3 while omitting these elements.

The semiconductor device IC further has a first lead LF1, a second lead LF2, a plated layer PL, a wire WR, a metal plate CLP, a third coupling member AL3, and a fourth coupling member AL4.

The first lead LF1 has two portions and one of them is present outside the semiconductor package member PKG and the remaining portion is present inside the semiconductor package member PKG. The portion present outside the semiconductor package member PKG is covered with the plated layer PL and is coupled to the mounting board MB via the plated layer PL. The first lead LF1 is coupled to an unillustrated pad of the mounting board MB with a coupling member such as solder. The plane area of this pad is greater than the plane area of a portion of the first lead LF1 to be coupled to the mounting board MB. To a portion of the first lead inside the semiconductor package member PKG is coupled the wire WR.

The second lead LF2 has two portions and one of them is present outside the semiconductor package member PKG and the remaining portion is present inside the semiconductor package member PKG. The portion present outside the semiconductor package member PKG is covered with the plated layer PL and is coupled to the mounting board MB via the plated layer PL. The second lead LF2 is coupled to an unillustrated pad of the mounting board MB with a coupling member such as solder. The plane area of this pad is greater than the plane area of a portion of the second lead LF2 to be coupled to the mounting board MB. To a portion of the second lead inside the semiconductor package member PKG is coupled the metal plate CLP via the fourth coupling member AL4.

The wire WR is present inside the semiconductor package member PKG. It is coupled, at one end thereof, to the first lead LF1 and, at the other end thereof, to a bonding pad on the upper surface of the semiconductor chip CP. The metal plate CLP is present inside the semiconductor package member PKG and it is coupled, at one end thereof, to the second lead LF2 via the fourth coupling member AL4 and, at the other end thereof, to the upper surface of the semiconductor chip CP via the third coupling member AL3.

The mounting board MB has a pad PD. The plane area of the upper surface of the pad PD is equal to the plane area of a portion of the second coupling member AL2 in contact with the upper surface of the pad PD. In a plan view, the second coupling member AL2 is coupled to the entire surface of the pad PD. In addition, the plane area of the upper surface of the pad PD is greater than the plane area of the lower surface of the die pad DP exposed from the semiconductor package member PKG.

There is a step difference (gap) SG formed by making the lower surface of the die pad DP exposed from the semiconductor package member PKG smaller than the upper surface of the die pad, in a plan view.

This step gap SG is provided in order to prevent the die pad DP from falling off from the semiconductor device IC not mounted on the mounting board. Due to this step gap SG, the area of the lower surface of the die pad DP exposed from the semiconductor package member PKG is smaller than the area of the upper surface of the die pad DP.

In FIG. 4, a distance (unit: cm) from the origin with the left end of the first coupling member AL1 as the origin is plotted along the abscissa, while a percent plastic strain is plotted along the ordinate.

As shown in the graph of FIG. 4, the plastic strain becomes large at both ends of the first coupling member AL1 (a region surrounding the first coupling member AL1 in a plan view). The plastic strain at the right-side end (on the side of the second lead LF2) of the first coupling member AL1 is greater than the plastic strain on the left-side end (on the side of the first lead LF1). In the semiconductor device IC not mounted on the mounting board as shown in FIGS. 1A to 1D, a percent plastic strain at the right end of the first coupling member AL1 is 0.87% (a broken line in the graph of FIG. 4) when a material as described later is used. When the semiconductor device IC has been coupled to the mounting board MB as shown in FIGS. 3A to 3D and the flexural rigidity $K_r$ is greater than the flexural rigidity $K_{MB}$, the percent plastic strain at the right-side end of this first coupling member AL1 is 0.92% when a material as described later is used (a dashed-dotted line in the graph of FIG. 4). When the semiconductor device IC has been coupled to the mounting board MB as shown in FIGS. 3A to 3D and the flexural rigidity $K_{IC}$ is smaller than the flexural rigidity $K_{MB}$ as in FIGS. 3A to 3D, the percent plastic strain at the right-side end of this first coupling member AL1 is 1.13% when a material as described later is used (a solid line in the graph of FIG. 4). Thus, when the semiconductor device IC has been coupled to the mounting board MB as shown in FIGS. 3A to 3D and the flexural rigidity $K_{IC}$ is smaller than the flexural rigidity $K_{MB}$ as shown in FIGS. 3A to 3D, the percent plastic strain at the end of this first coupling member AL1 becomes high, troubles such as damages including cracks tend to occur in the first coupling member AL1, and troubles such as separation between the semiconductor chip CP and the die pad DP tend to occur. It is to be noted that even when the flexural rigidity $K_{IC}$ is greater than the flexural rigidity $K_{MB}$, the percent plastic strain on the right-end side of the first coupling member AL1 becomes higher than that of the semiconductor device IC not mounted on the mounting board and compared with the semiconductor device IC not mounted on the mounting board, troubles such as damages including cracks tend to occur in the first coupling member AL1 and troubles such as separation between the semiconductor chip CP and the die pad DP due to the damages tend to occur.

Based on these facts, the present inventors have reached the embodiments which will be described later.

Embodiments will next be described in detail referring to attached drawings:

In the below-described embodiments, a description will be made after divided into a plurality of sections or embodiments if necessary for convenience sake. They are not independent from each other, but in a relation such that one is a modification example, application example, detailed description, a complementary description, or the like of a part or whole of the other one unless otherwise specifically indicated. And, in the below-described embodiments, when a reference is made to the number of elements (including the number, value, amount, range, or the like), the number is not limited to a specific number but may be more than or less than the specific number, unless otherwise specifically indicated or principally apparent that the number is limited to the specific number.

Further, in the below-described embodiments, the constituent elements (including behaviors, timing charts, element steps, behavior steps, and the like) are not always essential unless otherwise specifically indicated or principally apparent that they are essential. Similarly, in the below-described embodiments, when a reference is made to the shape, positional relationship, or the like of the constituent elements, that substantially approximate or similar to it is also embraced unless otherwise specifically indicated or principally apparent that it is not. This also applies to the above-mentioned number (including number, value, amount, range, and the like). In all the drawings for describing the below-described embodiments, portions or members having a like function will be identified by the same or like symbols and overlapping descriptions will be omitted. In the below-described embodiments, a repeated description of the same or like parts will be omitted in principle unless particularly necessary.

the drawings used in the embodiments, some cross-sectional views are not hatched in order to facilitate viewing of them. On the other hand, some plan views may be hatched to facilitate viewing of them.

First Embodiment

1. Basic Configuration and Principle Thereof

FIGS. 5A, 5B, 5C, and 5D include a cross-sectional view and a fragmentary plan view of an electronic device according to First Embodiment and a diagram showing thermal stresses produced when the electronic device is subjected to a temperature cycling test.

As shown in FIGS. 5A and 5D, the electronic device ED-T of FIGS. 3A to 3D and an electronic device ED are different in a second coupling member AL2-I and a pad PD-I. In the electronic device ED-T, the plane area of a portion of the second coupling member AL2 in contact with the die pad DP is equal to the plane area of the bottom surface of the die pad DP exposed from the semiconductor package member PKG. This means that the semiconductor device IC and the mounting board MB are coupled to each other with a wide plane area. In the electronic device ED, on the other hand, the plane area of a portion (second region) of the second coupling member AL2-I in contact with the die pad DP is smaller than the plane area of the bottom surface (first region) of the die pad DP exposed from the semiconductor package member PKG. The plane area of the pad PD-I is also made smaller than the plane area of the die pad DP. Compared with the electronic device ED-T shown in FIGS. 3A to 3D, the semiconductor device IC and the mounting board MB are coupled to each other with a smaller plane area. It is to be noted that in the more detailed structure, the semiconductor device IC is similar to that shown in FIG. 4 except for the second coupling member AL2 and the pad PD.

This electronic device ED is subjected to a temperature cycling test. Similar to the case shown in FIGS. 1A to 1D, a temperature to be applied is changed so that it fluctuates within a temperature range of from 110° C. to −30° C. The temperature condition in the temperature cycling test is not limited to the above-mentioned range, temperatures exceeding the glass transition temperature of the semiconductor package member PKG are not permitted. Moreover, as in the case of FIGS. 1A to 1D, materials used for the mounting board MB, die pad DP, semiconductor chip CP, semiconductor package member PKG, and semiconductor device IC and physical properties thereof (linear expansion coefficient and flexural rigidity) are as shown in FIG. 2.

As shown in FIG. 5B, thermal stresses TS1, TS2, TS3, and TS43 are generated in the electronic device ED as in the electronic device ED-T of FIGS. 3A to 3D.

Forces (1) and (2) as described in FIGS. 1A to 1D occur. In the case of a semiconductor device not mounted on a mounting board, the temperature cycling test may cause, in the semiconductor device IC, a force by which the die pad DP is bent to become wider than the semiconductor package member PKG. Different from the electronic device ED-T of FIGS. 3A to 3D, since the plane area of a portion of the second coupling member AL2-I in contact with the die pad DP is smaller than the plane area of the bottom surface of the die pad DP exposed from the semiconductor package member PKG, the semiconductor device IC and the mounting board MB are coupled to each other with a relatively small plane area. This makes it difficult to disturb the semiconductor device from being deformed by the mounting board MB. As a result, the die pad DP deforms to bend as shown in FIGS. 1A to 1D due to a force by which the die pad is bent to become wider than the semiconductor package member PKG. As shown in FIG. 5C, a stress to be applied to the first coupling member AL1 in the vicinity of the chip edge CE is relaxed to some extent, damages (troubles) of the first coupling member AL1 such as cracks are reduced, and troubles such as separation between the semiconductor chip CP and the die pad DP due to the damages are reduced. It is therefore possible to reduce troubles of an electronic device even if the electronic device is stored/operated in a severe environment like electronic devices to be mounted on automobiles or the like.

As shown in FIG. 4, the plastic strain at both ends of the first coupling member AL1 becomes large so that it is important that the deformation of the semiconductor device is not disturbed by the mounting board MB particularly near these ends. In a plan view, it is more desired to place the second coupling member AL2-I inside the first coupling member AL1.

The area of a portion of the bottom surface of the die pad DP exposed from the semiconductor package member PKG is not decreased and kept large so that this electronic device has a configuration excellent in heat radiation. When the die pad DP is used for a power source terminal, ground terminal, output terminal, or the like, it is necessary to increase the area of the second coupling member AL2-I to be brought into contact with the bottom surface of the die pad DP to some extent in order to reduce the ON resistance. This configuration is effective in such a case.

2. Detailed Configuration and Principle Thereof

In FIGS. 6A and 6B to FIGS. 11A and 11B, cross-sectional views and fragmentary schematic plan views of electronic devices having second coupling members different in shape, respectively, are shown with, as an example, a so-called HSOP (heatsink small outline package) having leads protruding from two side surfaces of a molding body opposite to each other and bent outward into an L shape (gullwing). The electronic devices shown in FIGS. 6A and 6B to FIGS. 11A and 11B are similar to the electronic device shown in FIG. 4 except for the shape of the second coupling member so that an overlapping description is omitted.

Figure 6A:
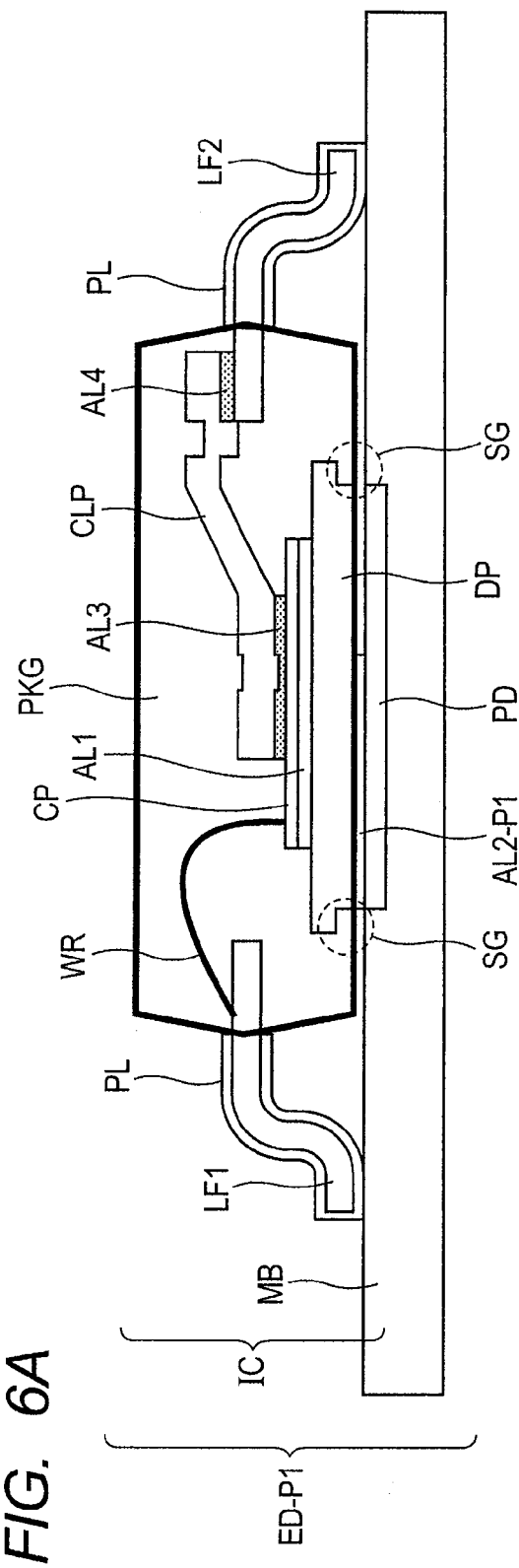
FIGS. 6A and 6B are a cross-sectional view and a plan view showing a first mode (coupling pattern 1) of a second coupling member of an electronic device, respectively.
Figure 6B:
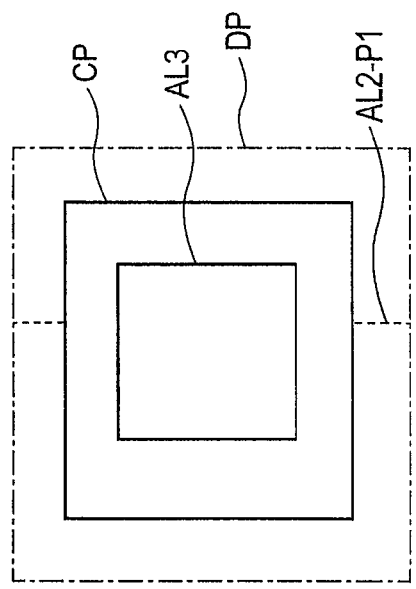
Figure 16:
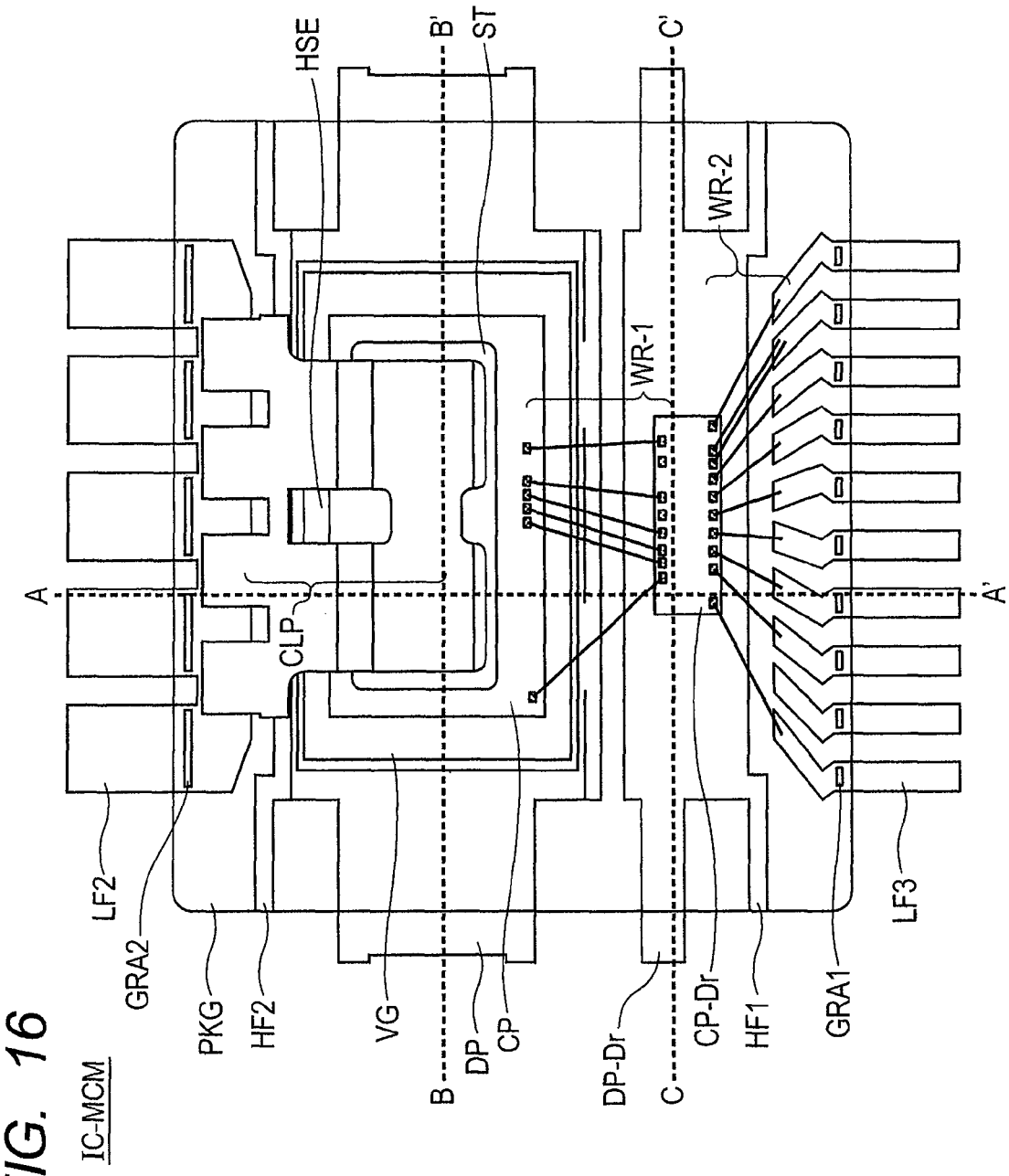
FIG. 16 is a top view (plan view) of a semiconductor device.

FIGS. 6A and 6B show an electronic device ED-P1 in which one of the end portions of a second coupling member AL2-P1 is present inside of an arrangement region of the third coupling member AL3 (coupling pattern 1). FIG. 6B is a plan view schematically showing the third coupling member AL3, the semiconductor chip CP, the lower surface of the die pad DP, and a portion of the second coupling member AL2-P1. Although the third coupling member AL3, the semiconductor chip CP, the lower surface of the die pad DP, and the second coupling member AL2-P1 shown here have a substantially square shape, they are quadrangular with upper and lower sides longer than the left and right sides as shown in FIG. 16 (this also applies to FIGS. 7 to 11). In FIG. 6B, the left end portion of the second coupling member AL2-P1 is present in the vicinity of the end portion of the die pad DP. The upper and lower end portions of the second coupling member AL2-P1 are present in the vicinity of the end portions of the die pad DP.

FIGS. 7A and 7B show an electronic device ED-P2 in which one of the end portions of a second coupling member AL2-P2 overlaps with the end portion of the arrangement region of the third coupling member AL3 on the side distant from the wire WR (coupling pattern 2). FIG. 7B is a plan view schematically showing the third coupling member AL3, the semiconductor chip CP, the lower surface of the die pad DP, and the second coupling member AL2-P2. In FIG. 7B, the left end portion of the second coupling member AL2-P2 is present in the vicinity of the end portion of the die pad DP. The upper and lower end portions of the second coupling member AL2-P2 are present in the vicinity of the end portions of the die pad DP.

FIGS. 8A and 8B shows an electronic device ED-P3 in which one of the end portions of a second coupling member AL2-P3 is present between the end portion of the arrangement region of the third coupling member AL3 on the side distant from the wire WR and the end portion of the arrangement region of the first coupling member AL1 on the side distant from the wire WR (coupling pattern 3). FIG. 8B is a plan view schematically showing the third coupling member AL3, the semiconductor chip CP, the lower surface of the die pad DP, and the second coupling member AL2-P3. In FIG. 8B, the left end portion of the second coupling member AL2-P3 is present in the vicinity of the end portion of the die pad DP. The upper and lower end portions of the second coupling member AL2-P3 are present in the vicinity of the end portions of the die pad DP.

FIGS. 9A and 9B show an electronic device ED-P4 in which one of the end portions of a second coupling member A1-P4 overlaps with the end portion of the arrangement region of the first coupling member AL1 on the side distant from the wire WR (coupling pattern 4). FIG. 9B is a plan view schematically showing the third coupling member AL3, the semiconductor chip CP, the bottom surface of the die pad DP, and the second coupling member AL2-P4. In FIG. 9B, the left end portion of the second coupling member AL2-P4 is present in the vicinity of the end portion of the die pad DP. The upper and lower end portions of the second coupling member AL2-P4 are present in the vicinity of the end portions of the die pad DP.

FIGS. 10A and 10B show an electronic device ED-P5 in which one of the end portions of a second coupling member AL-P5 is present between the end portion of the arrangement region of the first coupling member AL1 on the side distant from the wire WR and the end portion of the region of the die pad DP exposed from the semiconductor package member PKG on the side distant from the wire WR (coupling pattern 5). FIG. 10B is a plan view schematically showing the third coupling member AL3, the semiconductor chip CP, the bottom surface of the die pad DP, and the second coupling member AL2-P5. In FIG. 10B, the left end portion of the second coupling member AL2-P5 is present in the vicinity of the end portion of the die pad DP. The upper and lower end portions of the second coupling member AL2-P5 are present in the vicinity of the end portions of the die pad DP.

FIGS. 11A and 11B show an electronic device ED-P6 in which one of the end portions of a second coupling member AL-P6 overlaps with the end portion of the region of the die pad DP exposed from the semiconductor package member PKG on the side distant from the wire WR (coupling pattern 6). FIG. 11B is a plan view schematically showing the third coupling member AL3, the semiconductor chip CP, the bottom surface of the die pad DP, and the second coupling member AL2-P6. In FIG. 11B, the left end portion of the second coupling member AL2-P6 is present in the vicinity of the end portion of the die pad DP. The upper and lower end portions of the second coupling member AL2-P6 are present in the vicinity of the end portion of the die pad DP. It is to be noted that FIGS. 11A and 11B are similar to FIGS. 3A to 3D in shape.

In the coupling patterns 1 to 5, the plane area of a portion of each of the second coupling members AL2-P1, AL2-P2, AL2-P3, AL2-P4, and AL2-P5 in contact with the die pad DP is smaller than the plane area of the bottom surface of the die pad DP exposed from the semiconductor package member PKG so that the semiconductor device IC and the mounting board MB are coupled to each other with a smaller plane area compared with the coupling pattern 6. Deformation of the semiconductor device IC is therefore less disturbed by the mounting board MB. As a result, compared with the coupling pattern 6, damages (troubles) such as cracks in the first coupling member AL1 due to temperature cycling are reduced and troubles such as separation between the semiconductor chip CP and the die pad DP caused by these damages are reduced.

Figure 12:
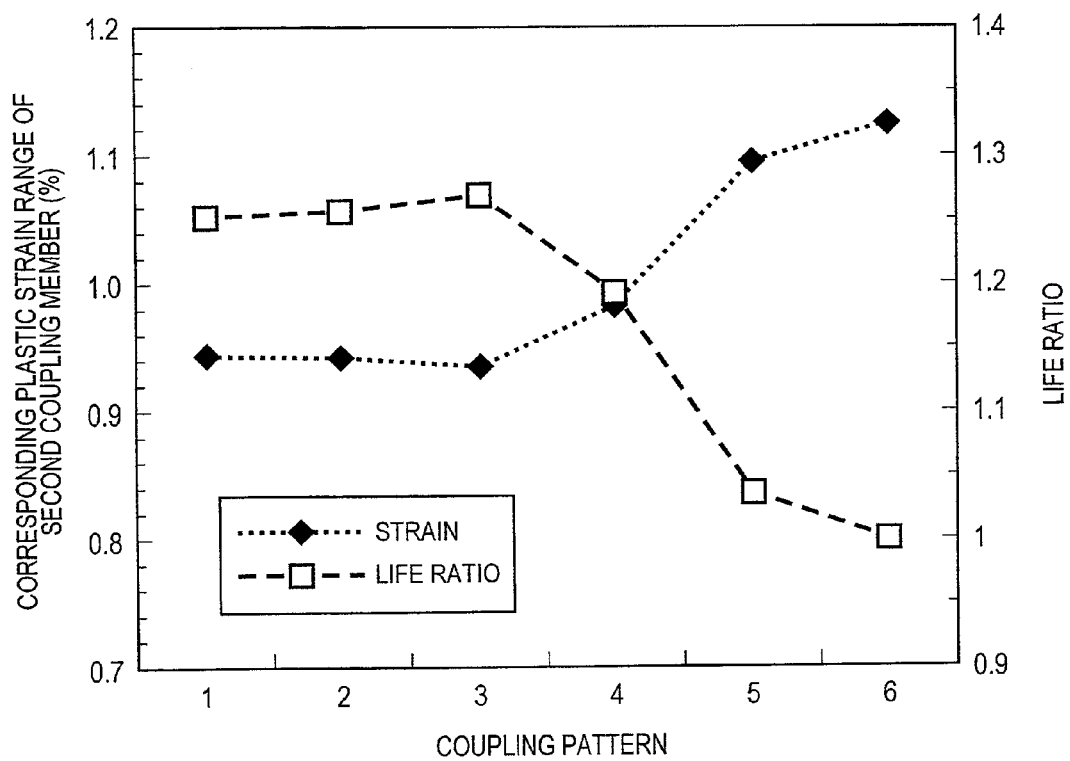
FIG. 12 shows the relationship between a coupling pattern and a plastic strain of a second coupling member.

As shown in FIG. 12, the plastic strain (corresponding plastic strain range) of the second coupling member increases drastically with the electronic device ED-P4 showing the coupling pattern 4 as a boundary. This suggests that it is more preferred to place, in a plan view, one of the end portions of the second coupling member AL-P4 of the electronic device ED-P4 inside the end portion of the arrangement region of the first coupling member AL1 (semiconductor chip CP).

It is to be noted that a region of the die pad DP exposed from the semiconductor package member PKG and, in a plan view, having no second coupling member is preferably present on the side near the second lead LF2 (in a region overlapping with the metal plate CLP in a plan view). This is because the metal plate CLP having a high thermal expansion coefficient α expands greatly when heat is applied so that bending of the semiconductor device IC is disturbed by a force that bends so as to widen the die pad DP more than the semiconductor package PKG as shown in FIGS. 5A to 5D. This is also apparent from the data that as shown in FIG. 4, the plastic strain is greater at the end portion of the first coupling member AL1 on the side near the second lead LF2 than at the end portion of the first coupling member AL1 on the side near the first lead LF1. Without a problem in heat resistance as will be described later, the region of the die pad DP exposed from the semiconductor package member PKG and in a plan view, having no second coupling member may be present on the side near the first lead LF1. This means that similar to the second coupling member AL2-I shown in FIGS. 5A to 5D, the second coupling member may be placed in the vicinity of the center of the semiconductor chip CP. Without a problem of heat resistance as will be described later, in FIGS. 6B to FIG. 10B, the upper end portion and the lower end portion of each of the second coupling members AL2-P1, AL2-P2, AL2-P3, AL2-P4, and AL2-P5 may be present inside the end portion of the die pad DP, between the end portion of the die pad and the end portion of the semiconductor chip CP, or between the end portion of the semiconductor chip CP and the end portion of the third coupling member AL3.

Figure 13:
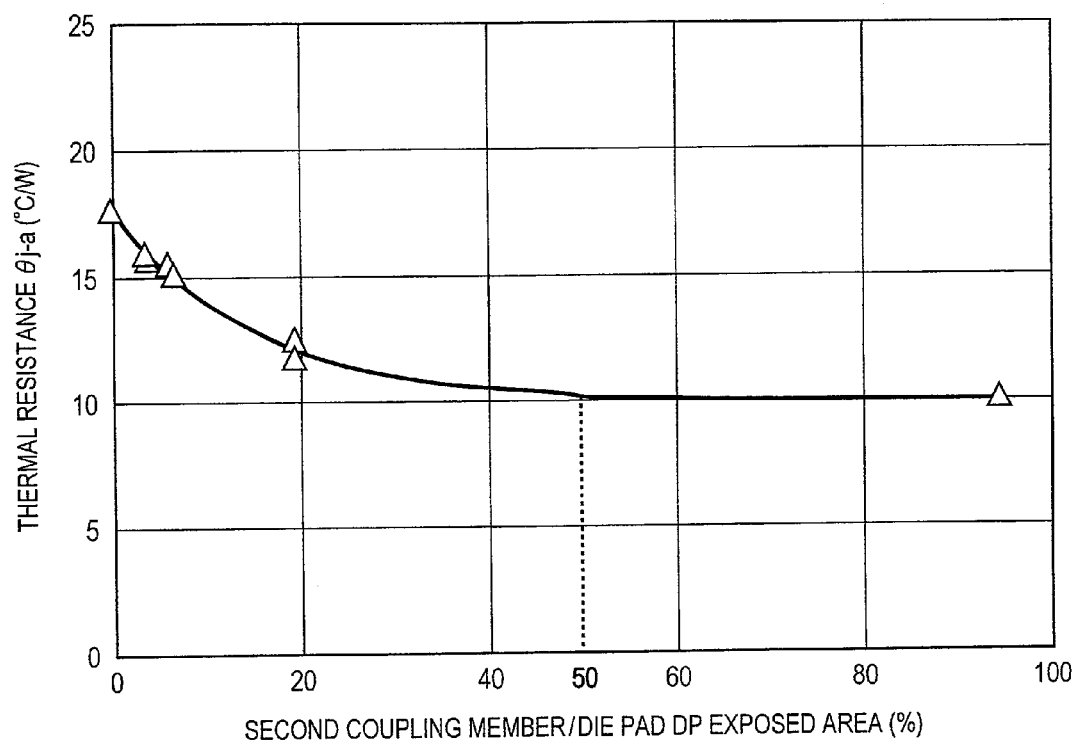
FIG. 13 shows the relationship between thermal resistance and a second coupling member.

FIG. 13 is a graph showing the relationship between the heat resistance and the second coupling member. This drawing shows dependence of heat resistance (θj-a (° C./W)) on the coupled area of the die pad.

It is apparent from FIG. 13 that heat resistance decreases sufficiently when a ratio of the plane area of a portion of the second coupling member AL2-I in contact with the bottom surface of the die pad DP in the plane area of the bottom surface of the die pad DP exposed from the semiconductor package member PKG (which ratio will hereinafter be called "second coupling member area ratio") exceeds 50%. It is to be noted that the second coupling member area ratio of the electronic device ED-P1 (coupling pattern 1) shown in FIGS. 6A and 6B is 50% or greater. Particularly when the semiconductor device IC of the electronic device ED has a power transistor such a power MOSFET or inverter output stage (MOSFET to be used for a switch circuit of an upper-side arm and MOSFET to be used for a switch circuit of a lower-side arm), it is important to satisfy the above-mentioned condition in order to suppress heat generation of the electronic device ED. In addition, satisfying the above-mentioned condition is effective from the standpoint of reducing the ON resistance.

In First Embodiment, the main constituent elements of the electronic device are made of the following materials. The metal plate CLP is made of any of copper, copper alloys, aluminum, and aluminum alloys. The wire WR is made of any of gold, copper, and aluminum. The first lead LF1 and the second lead LF2 are made of any of copper and copper alloys. The semiconductor package member PKG is made of a thermosetting resin material. It may be an epoxy resin or biphenyl resin containing any of a filler, a phenol curing agent, and a silicone rubber. The glass transition temperature of such a semiconductor package member PKG is from 150° C. to 180° C. and in a temperature region exceeding this glass transition temperature, the linear expansion coefficient $\alpha_{PKG}$ becomes greater than the linear expansion coefficient $\alpha_{DP}$. The die pad is made of any of copper and copper alloys. The first coupling member AL1, second coupling member AL2-I, third coupling member AL3, and fourth coupling member AL4 are each made of a conductive material such as silver paste, solder paste, or lead-free solder. The mounting board MB has, as an insulating material, any of a glass epoxy resin, a BT resin, and a polyimide resin.

The materials of the main constituent elements of the electronic device ED are not limited to the above-mentioned ones, but it is necessary to satisfy the following equation:

Linear expansion coefficient $\alpha_{DP} > \alpha_{PKG}$.

In FIGS. 6 to 10, the plane area of a portion of each of the second coupling members AL2-P1, AL2-P2, AL2-P3, AL2-P4, and AL2-P5 in contact with the pad PD is smaller than the plane area of the pad PD, but it is more preferred to make the plane area of a portion of each of the second coupling members AL2-P1, AL2-P2, AL2-P3, AL2-P4, and AL2-P5 in contact with the pad PD equal to the plane area of the pad PD. In other words, it is more preferred to make the area of the upper surface of the pad PD smaller than the area of the back surface of the die pad DP. When the pad PD is smaller than the die pad. DP and the second coupling member AL2-I is made of a solder or the like, it is possible to easily make the plane area of a portion of the second coupling member AL2-I in contact with the pad PD smaller than the plane area of the bottom surface of the die pad DP by coupling the second coupling member AL2-I placed on the pad PD to the die pad DP.

Moreover, when heat resistance can be reduced sufficiently, it is more desirable to place, in a plan view, the second coupling member AL2-I inside the first coupling member AL1 as shown in FIGS. 5A to 5D. When an area of a portion of the second coupling member AL2-I in contact with the die pad DP becomes too small and heat resistance cannot be reduced sufficiently, on the other hand, a region of the die pad DP exposed from the semiconductor package member PKG and, in a plan view, having no second coupling member AL2-I is preferably present on the side near the second lead LF2 as in the coupling patterns 1 to 4 shown in FIGS. 6A and 6B or FIGS. 7A and 7B. Moreover, the semiconductor chip CP has a power MOSFET.

Figure 15:
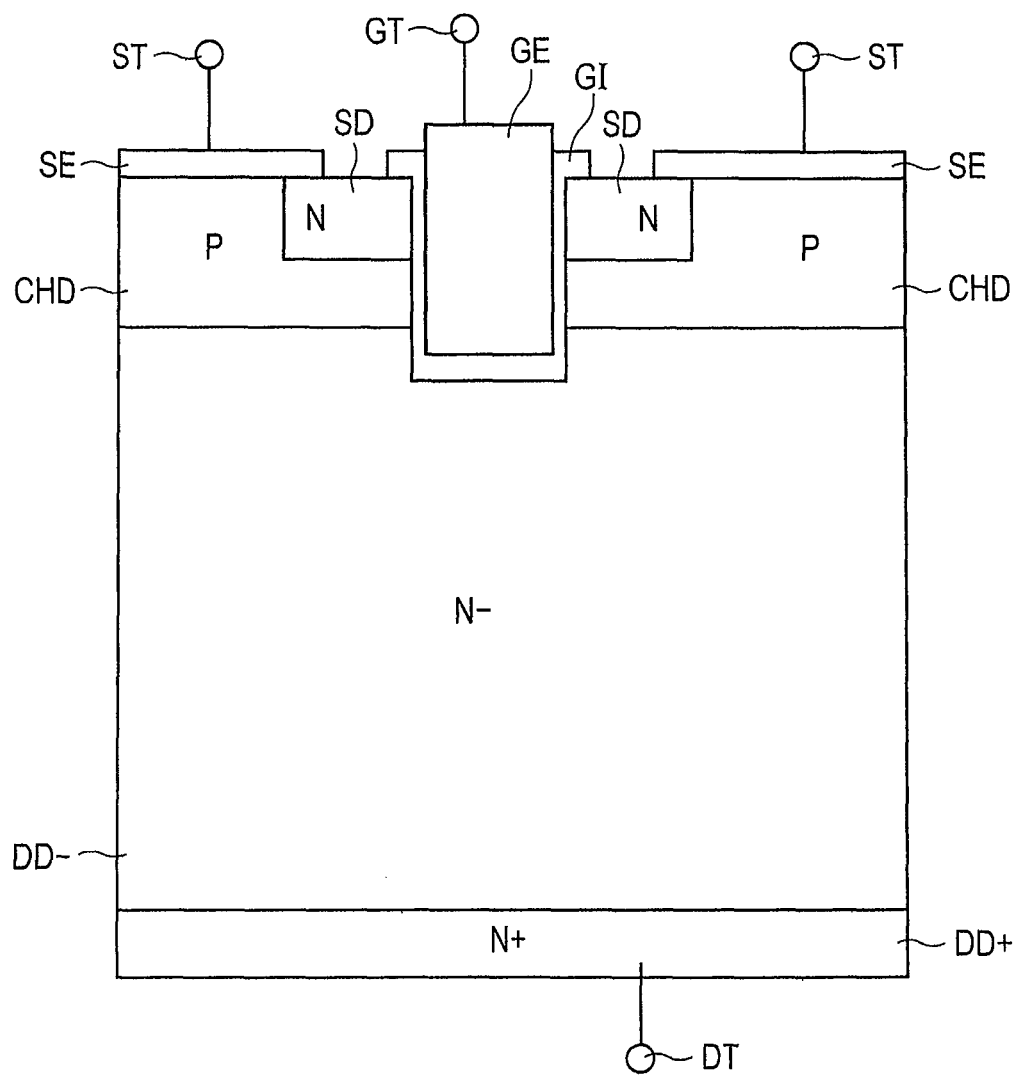
FIG. 15 is a fragmentary cross-sectional view of a semiconductor chip.

It is to be noted that the semiconductor chip CP has, on the back surface thereof, a drain pad DT as shown in FIG. 15 so that the die pad DP functions also as an external terminal.

Second Embodiment

Figure 14:
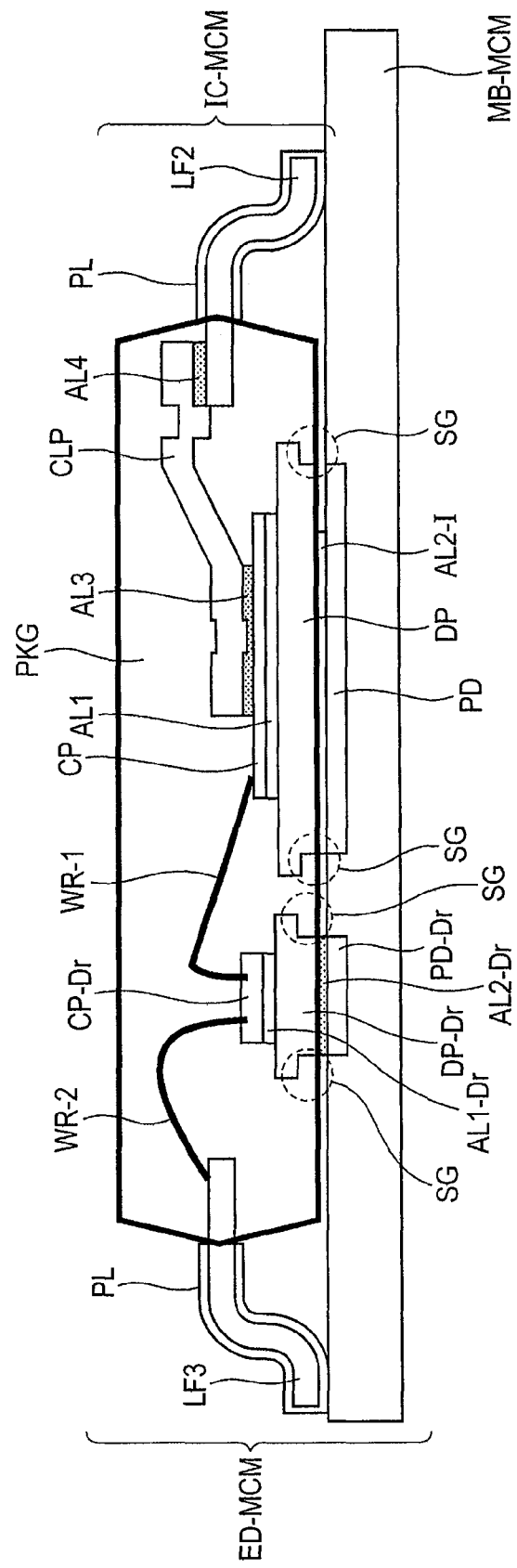
FIG. 14 is a cross-sectional view of an electronic device according to Second Embodiment.

FIG. 14 is a cross-sectional view of an electronic device according to Second Embodiment.

Compared with the electronic device ED according to First Embodiment, the electronic device ED-MCM further has a driver semiconductor chip (which may hereinafter be called "driver IC") CP-Dr, a first wire WR-1, a second wire WR-2, a driver die pad DP-Dr, a driver pad PD-Dr, a driver first coupling member AL1-Dr, and a driver second coupling member AL2-Dr. The wire WR is therefore omitted. The first lead LF1 is replaced with a third lead LF3 and the semiconductor device IC is replaced with a semiconductor device IC-MCM. The semiconductor device IC-MCM has a semiconductor chip CP and a driver semiconductor chip CP-DR driving the semiconductor chip CP and they are molded in one HSOP type package. In addition, the semiconductor chip CP has, on one semiconductor substrate, a power MOSFET, a temperature sensor, and the like.

The driver die pad DP-Dr has, on the upper surface thereof, the driver semiconductor chip CP-Dr and the driver die pad DP-Dr and the driver semiconductor chip CP-Dr are coupled to each other via the driver first coupling member AL1-Dr. The upper surface of the driver semiconductor chip CP-Dr and the respective side surfaces of the driver semiconductor chip CP-Dr and the driver die pad DP-Dr are covered with a semiconductor package member PKG. To the entire lower surface of the driver die pad DP-Dr exposed from the semiconductor package member PKG is coupled the driver second coupling member AL2-Dr, while to the entire upper surface of the driver pad PD-Dr is coupled the driver second coupling member AL2-Dr. The plane area of the driver die pad DP-Dr exposed from the semiconductor package member PKG is equal to the plane area of a portion of the driver second coupling member AL2-Dr in contact with the driver die pad DP-Dr. In addition, the plane area of portion of the second coupling member AL2-Dr in contact with the driver pad PD-Dr is equal to the plane area of the driver pad PD-Dr. The plane area of the driver pad PD-DR is slightly greater than the plane area of the driver die pad DP-Dr.

The second wire WR-2 is coupled, at one end thereof, to a bonding pad on the upper surface of the driver semiconductor chip CP-Dr and the second wire WR-2 is coupled, at the other end thereof, to the third lead LF3. The first wire WR-1 is coupled, at one end thereof, to a bonding pad on the upper surface of the driver semiconductor chip CP-Dr and the first wire WR-1 is coupled, at the other end thereof, to a bonding pad on the upper surface of the semiconductor chip CP. The first wire WR-1 and the second wire WR-2 are placed inside the semiconductor package member PKG.

A mounting board MB-MCM has, in addition to the mounting board MB, the driver pad PD-Dr. The lower surface of the driver die pad DP-Dr exposed from the semiconductor package member PKG is coupled to the upper surface of the driver pad PD-Dr via the driver second coupling member AL2-Dr. The second lead LF2 and the third lead LF3 are coupled to respective unillustrated pads of the mounting board MB-MCM with a coupling member such as solder. The plane area of each of these pads is greater than the plane area of a portion of each of the second lead LF2 and the third lead LF3 to be coupled to the mounting board MB.

Similar to First Embodiment, the plane area of a portion of the second coupling member AL2-I in contact with the die pad DP is smaller than the plane area of the lower surface of the die pad DP exposed from the semiconductor package member PKG. In principle, a stress due to temperature cycling is proportionate to a volume. With regards to the electronic device ED-MCM, the length in the thickness direction (stacking direction of the pad PD, the die pad DP, and the semiconductor chip CP) is not so large so that a large stress does not occur in the thickness direction. In the direction vertical to the thickness direction, however, the plane area of each of the die pad DP, the semiconductor chip CP, the driver die pad DP-Dr, the driver semiconductor chip CP-Dr, and the semiconductor package member PKG configuring the semiconductor device IC-MCM has a certain size so that a stress due to temperature cycling is substantially proportionate to the plane area. The semiconductor chip CP having a power MOSFET has a wide plane area in order to reduce the ON resistance. The plane area of the die pad DP on which the wide semiconductor chip is mounted is therefore also wide. On the other hand, the plane area of the driver semiconductor chip CP-Dr is smaller than that of the semiconductor chip CP so that the plane area of the driver die pad DP-Dr on which this smaller driver semiconductor chip CP-Dr is mounted is also small. Moreover, the plane area of a portion of the first coupling member AL1 in contact with the semiconductor chip CP is substantially equal to the plane area of the semiconductor chip CP, while the plane area of a portion of the driver first coupling member AL1-Dr in contact with the driver semiconductor chip CP-Dr is equal to the plane area of the driver semiconductor chip CP-Dr. This means that a stress due to temperature cycling applied to the end portion of the first coupling member AL1 having a wide plane area is large as shown in FIG. 4, but a stress due to temperature cycling applied to the end portion of the driver first coupling member AL1-Dr having a small plane area is not so large. The plane area of a portion of the second coupling member AL2-I in contact with the die pad DP is smaller than the plane area of the die pad DP exposed from the semiconductor package member PKG in order to reduce this stress, but the plane area of a portion of the driver second coupling member AL2-Dr which has less stress-reducing necessity in contact with the driver die pad DP-Dr is equal to the plane area of the driver die pad DP-Dr exposed from the semiconductor package member PKG. A ratio of the plane area of a portion of the second coupling member AL2-I in contact with the die pad DP in the plane area of the bottom surface of the die pad DP exposed from the semiconductor package member PKG (a second coupling member area ratio) is smaller than a ratio of the plane area of a portion of the driver second coupling member AL2-Dr in contact with the driver die pad DP-Dr in the plane area of the bottom surface of the driver die pad DP-Dr exposed from the semiconductor package member PKG.

In a plan view, there is a step difference (step gap) SG formed by making the lower surface of the driver die pad DP-Dr exposed from the semiconductor package member PKG smaller than the upper surface of the driver die pad DP-Dr in addition to a step difference (step gap) SG formed by making the lower surface of the die pad DP exposed from the semiconductor package member PKG smaller than the upper surface of the die pad DP. This step gap SG is provided in order to prevent the driver die pad DP-Dr from falling from the semiconductor device IC not mounted on the mounting board. By the presence of this step gap SG, the area of the lower surface of the driver die pad DP-Dr exposed from the semiconductor package member PKG is smaller than the area of the upper surface of the driver die pad DP-Dr.

In FIG. 14, the plane area of a portion of the second coupling member AL2-I in contact with the pad PD is smaller than the plane area of the pad PD, but it is preferred to make the plane area of a portion of the second coupling member AL2-I in contact with the pad PD equal to the plane area of the pad PD. In other words, it is more preferred to make the area of the upper surface of the pad PD smaller than the area of the back surface of the die pad DP. When the pad PD is smaller than the die pad DP and the second coupling member AL2-I is made of a solder or the like, it is possible to easily make the plane area of a portion of the second coupling member AL2-I in contact with the pad PD smaller than the plane area of the bottom surface of the die pad DP by coupling the second coupling member AL2-I placed on the pad PD to the die pad DP.

FIG. 15 is a fragmentary cross-sectional view of the semiconductor chip CP. The semiconductor chip CP has a vertical power MOSFET.

The semiconductor chip CP has, on the upper surface side thereof, a source electrode SE and a gate electrode GE. The source electrode SE has therebelow a source diffusion layer SD and a channel diffusion layer CHD. The channel diffusion layer CHD is placed also at a position deeper than the depth of the source diffusion layer SD so that in a cross-sectional view, the source diffusion layer SD is placed so as to be sandwiched between the channel diffusion layer CHD and the gate electrode GE and the channel diffusion layer CHD is placed on the bottom surface of the source diffusion layer SD. The channel diffusion layer CHD has therebelow a drain diffusion layer DD−. The gate electrode GE penetrates through the source diffusion layer SD and the channel diffusion layer CHD and extends to reach the drain diffusion layer DD−. A gate insulating film GI is placed between the gate electrode GE and each of the source diffusion layer SD, the channel diffusion layer CHD, and the drain diffusion layer DD−. The drain diffusion layer DD− has therebelow a drain diffusion layer DD+ corresponding to the lower surface side of the semiconductor chip CP.

The source diffusion layer SD, the drain diffusion layer DD− and the drain diffusion layer DD+ are N type semiconductor layers obtained by adding an element such as arsenic or phosphorus to silicon. The concentration of the element thus added is highest in the drain diffusion layer DD+. It is second highest in the source diffusion layer SD. The concentration is lowest in the drain diffusion layer DD−. The channel diffusion layer CHD becomes a P type semiconductor layer obtained by adding an element such as boron or aluminum to silicon.

A source pad ST is electrically coupled to the source electrode SE; a gate pad GT is electrically coupled to the gate electrode GE; and the drain diffusion layer DD+ is electrically coupled to a drain pad DT. The source pad ST is coupled to a metal plate CLP via a coupling member AL3; and the drain pad DT is coupled to the die pad DP via a coupling member AL1. The source pad ST, gate pad GT, and the drain pad DT are not shown as a device structure in FIG. 15. The source pad ST, the gate pad GT, and the drain pad DT are however formed on the upper surface (surface) or lower surface (back surface) of the semiconductor chip CP as a metal film such as aluminum (Al) film.

When a high-level voltage is applied to the gate pad GT, an inversion layer appears in a portion of the channel diffusion layer CHD in the vicinity of the gate insulating film GI and the source diffusion layer SD and the drain diffusion layer DD− are electrically coupled to each other via the inversion layer. As a result, current flows between the source pad ST and the drain pad DT. When a low-level voltage is applied to the gate pad GT, no inversion layer appears in a portion of the channel diffusion layer CHD in the vicinity of the gate insulating film GI and the source diffusion layer SD and the drain diffusion layer DD are electrically isolated from each other by the channel diffusion layer CHD. As a result, no current flows between the source pad ST and the drain pad DT.

Figure 17:
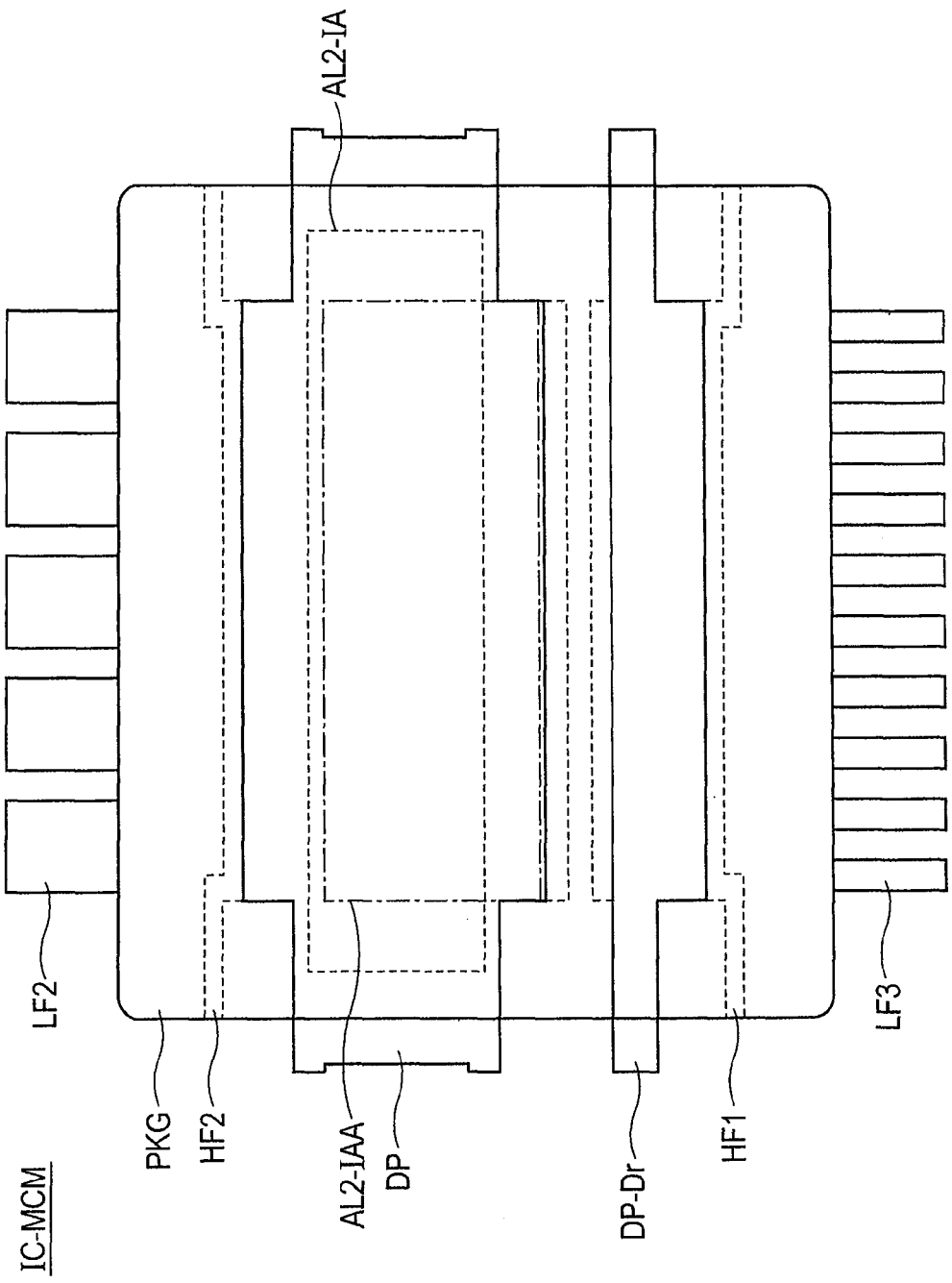
FIG. 17 is a bottom view (backside view) of the semiconductor device.

FIG. 16 is a top view (plan view) of the semiconductor device according to Second Embodiment. From this drawing, however, the upper portion of the semiconductor package member PKG is omitted. FIG. 17 is a bottom (back surface) view of the semiconductor device according to Second Embodiment. In this drawing, a portion of the die pad and a tab suspending lead not exposed from a semiconductor package member is shown by a broken line. FIGS. 18A and 18B are cross-sectional views of the semiconductor device of FIG. 16 taken along a broken line B-B' and a broken line C-C', respectively.

The semiconductor device IC-MCM has, in addition to the constituent elements shown in FIG. 14, a first recess GRA1, a second recess GRA2, a first suspending lead HF1, a second suspending lead HF2, a groove VG, and a hole HSE. The hole HSE is a hole penetrating through the metal plate CLP.

The second lead LF2 has a plurality of first plate portions which will serve as external terminals and second plate portions to be coupled to the metal plate CLP. The first plate portions are exposed outside of the semiconductor package member PKG and the first plate portions and the second plate portions are coupled to each other inside the semiconductor package member PKG. Inside the semiconductor package member PKG, there is the second recess GRA2 for enhancing the adhesive strength with the semiconductor package member PKG in the vicinity of a joint between the first plate portion and the second plate portion. The second lead LF2 has a width greater than that of the third lead LF3 in order to decrease the ON resistance of the second lead LF2 through which high current flows. When the number of the second leads is increased while decreasing their width to that of the third leads LF3, the whole width becomes smaller by the width corresponding to the spaces between them. This means that the whole width can be made greater not by increasing the number of leads but by increasing the width of one lead and as a result, the ON resistance can be decreased.

The die pad DP has, adjacent thereto, a second suspending lead HF2 as a frame suspension for suspending this die pad DP during manufacturing steps. This second suspending lead HF2 and the die pad DP are made of a one-body metal. It is to be noted that the back surface of the second suspending lead HF2 is half-etched or the like so as not be exposed from the semiconductor package member PKG.

The die pad DP has a groove VG for preventing the first coupling member AL1 formed on the die pad DP from flowing around the member.

The die pad DP has thereon the semiconductor chip CP and the die pad DP and the semiconductor chip CP are coupled to each other via the first coupling member AL1. The plane area of the semiconductor chip CP is smaller than the plane area of the die pad DP. The semiconductor chip CP has, on a portion of the upper surface thereof, the source pad ST. The source pad ST and one end of the metal plate CLP are coupled to each other via the coupling member AL3, while the other end of the metal plate CLP and the second lead LF2 are coupled to each other via the coupling member AL4. The metal plate CLP is bent at a plurality of positions in order to be electrically coupled to the source pad ST and the second lead LF2.

There is a plurality of the third leads LF3. A portion of the third lead is exposed outside from the semiconductor package member PKG and the rest is present inside the semiconductor package member PKG. The third leads LF3 each have, inside the semiconductor package member PKG and in the vicinity between the semiconductor package member PKG and the portion of the third lead LF3 exposed from the semiconductor package member PKG, the first recess GRA1 for increasing the adhesive strength with the semiconductor package member PKG.

The driver die pad DP-Dr has, adjacent thereto, the first suspending lead HF1 as a frame suspension for suspending this driver die pad DP-Dr during manufacturing steps. This first suspending lead HF1 and the driver die pad DP-Dr are made of a one-body metal. A portion of the driver die pad DP-DR having thereon no semiconductor chip CP-Dr and the back surface of the first suspending lead HF1 are half-etched or the like so as not be exposed from the semiconductor package member PKG.

The driver die pad DP-Dr has thereon the driver semiconductor chip CP-Dr. The driver die pad DP-Dr and the driver semiconductor chip CP-Dr are coupled to each other via the driver first coupling member AL1-Dr.

There are a plurality of the first wires WR-1 and a plurality of the second wires WR-2. The second wires WR-2 are each coupled, at one end thereof, to the bonding pad on the upper surface of the driver semiconductor chip CP-Dr and the second wires WR-2 are each coupled, at the other end thereof, to the third leads LF3. The first wires WR-1 are each coupled, at one end thereof, to the bonding pad on the upper surface of the driver semiconductor chip CP-Dr and the first wires WR-1 are each coupled, at the other end thereof, to the bonding pad (gate pad GT or the like) on the upper surface of the semiconductor chip CP. These first-wires WR-1 and second wires WR-2 are placed inside the semiconductor package member PKG.

From a device (such as controller) in the electronic device ED-MCM other than the semiconductor device IC-MCM or a device outside the electronic device ED-MCM, various control signals and supply voltage system are input to the driver semiconductor chip CP-Dr via some of the third leads LF3. The output from the driver semiconductor chip CP-Dr to a controller or the like is conducted via some of the third leads LF3. The driver semiconductor chip CP-DR processes these various control signals and outputs signals for driving and controlling the semiconductor chip CP to the semiconductor chip CP via some of the first wires WR-1. The output from the driver semiconductor chip CP-Dr to the outside of the semiconductor device IC-MCM is conducted via some of the first wires. A gate drive signal formed by the driver semiconductor chip CP-Dr and input to the gate pad ST of the power MOSFET is caused to flow through one of the first wires WR-1.

More specifically, the semiconductor device IC-MCM is controlled by a control signal output from an unillustrated controller. The driver semiconductor chip CP-Dr receiving the control signal from the controller creates a drive signal. This drive signal is input to the gate pad GT of a power MOSFET built in the semiconductor chip CP. By turning ON or OFF of the power MOSFET, a load (not illustrated) to be coupled to a source terminal is driven. The driver semiconductor chip CP-Dr receives a signal from a built-in temperature sensor of the semiconductor chip CP. When it detects an excessive temperature, it turns OFF the power MOSFET. The driver semiconductor chip CP-Dr on the other hand detects an excess current of the load by detecting the current of a current mirror MOS having cells fewer at a certain ratio and controls the gate of the built-in power MOSFET of the semiconductor chip CP so as to prevent passage of an electric current of a certain level or greater.

In a plan view, the semiconductor package member PKG, a heat spreader HS, the semiconductor chip CP, and the driver semiconductor chip CP-Dr are almost rectangular, though they are sometimes slightly rounded at some corners thereof. In a plan view, the semiconductor package member PKG has a first side, a second side, a third side, and a fourth side and these first to fourth sides configure a rectangle. The first side and the third side are opposite to each other and the second side and the fourth side are opposite to each other. A plurality of the second leads LF2 is placed along the first side, while a plurality of the third leads LF3 is placed along the third side. With regards to the arrangement of the constituent elements of the semiconductor device IC-MCM, the plurality of the second leads LF2 and the plurality of the third leads LF3 have therebetween the driver semiconductor chip CP-Dr, the driver die pad DP-Dr, and the first suspending lead HF1. With regards to the arrangement of the constituent elements of the semiconductor device IC-MCM, the plurality of the second leads LF2 and the driver semiconductor chip CP-Dr, driver die pad DP-Dr, and the first suspending lead HF1 have therebetween the semiconductor chip CP, the die pad DP, and the second suspending lead HF2. The plane area of the driver semiconductor chip CP-Dr is smaller than the plane area of the semiconductor chip CP.

The arrangement range of the second coupling member Al2-IAA is preferably within a dashed-dotted line. The arrangement range of the second coupling member AL2-IAA is placed outside the semiconductor chip CP on the side of the driver semiconductor chip CP-Dr and inside the semiconductor chip CP on the side of the second lead LF2. Moreover, the plane area of the arrangement range of the second coupling member AL2-IAA is greater than the plane area of the semiconductor chip CP. This makes it possible to reduce heat resistance and therefore reduce damages such as cracks at the end portion of the semiconductor chip covered with the metal plate CLP as shown in FIG. 4.

The arrangement range of the second coupling member AL2-IA may be within a dashed line. This means that as the second coupling member AL-2-IA, the arrangement range of the second coupling member AL2-IA is present inside the arrangement range of the semiconductor chip CP (arrangement range of the first coupling member AL1) in the cross-sectional view of FIG. 14. In FIG. 17, however, the right and left end portions of the second coupling member AL-2-IA are present outside the semiconductor chip CP. It is only necessary to satisfy the area percentage of the second coupling member to be 50% or greater as shown in FIG. 13.

The cross-sectional view of FIG. 14 is a cross-section taken along a dotted line A-A' of FIG. 16. This cross-sectional view includes one of the wires WR-1 and the wires WR-2, but FIG. 14 shows the overall view of the wires WR-1 and WR-2.

Materials of the constituent elements of the electronic device ED-MCM according to Second Embodiment are similar to those of the electronic device ED according to First Embodiment. Materials of the constituent elements not used in the electronic device ED are as follows. The wires WR1 and WR2 are, similar to the wire WR, made of any of gold, copper, and aluminum. The third lead LF3 is, similar to the second lead LF2, made of copper or a copper alloy. The driver die pad DP-DR is, similar to the die pad DP, made of copper or a copper alloy. The driver first coupling member AL1-Dr and the driver second coupling member AL2-Dr are, similar to the first coupling member AL1 and the second coupling member AL2-I, made of a conductive material such as silver paste, solder paste, or lead-free solder.

Third Embodiment

Figure 19:
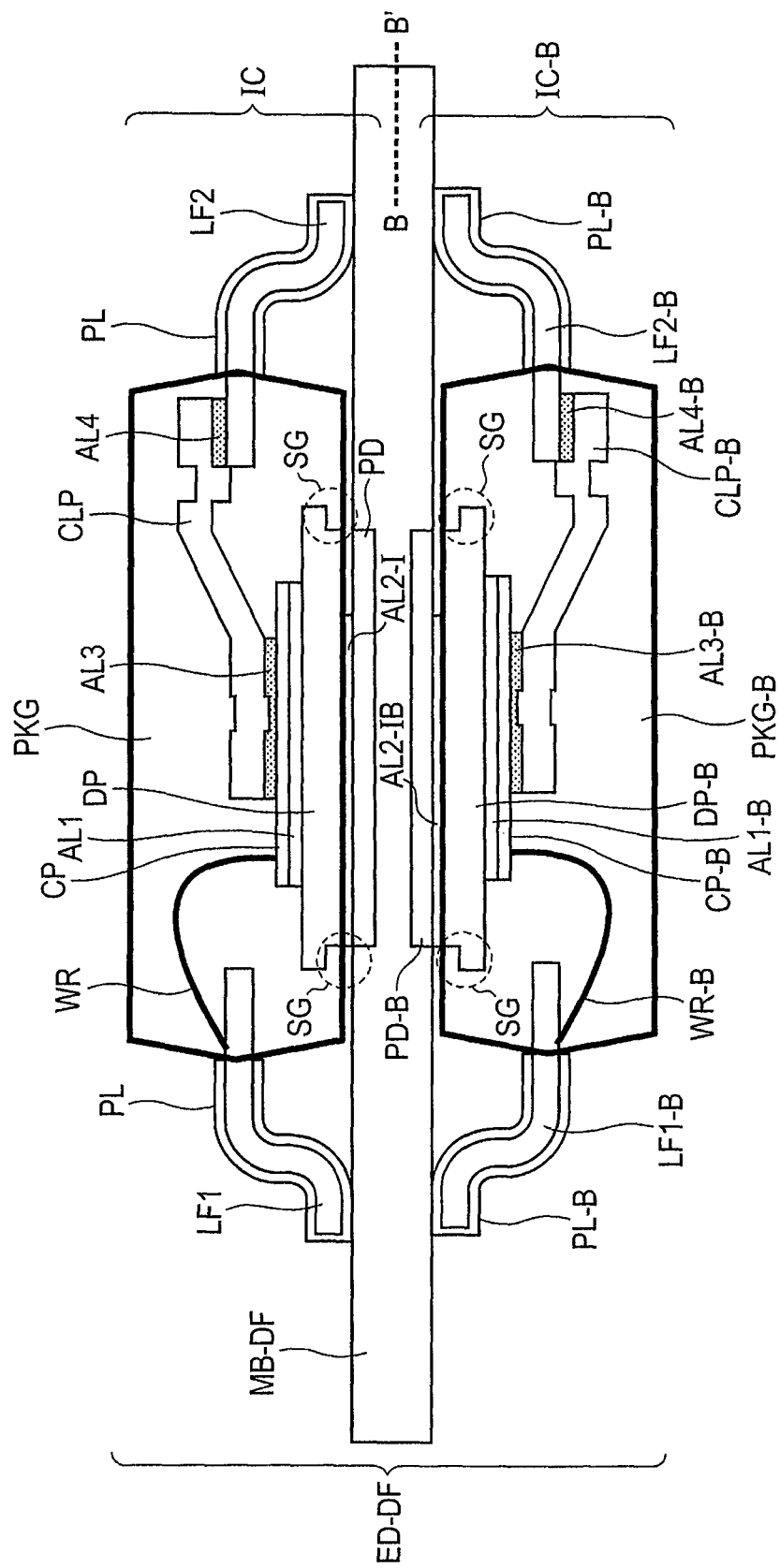
FIG. 19 is a cross-sectional view of an electronic device according to Third Embodiment.

FIG. 19 is a cross-sectional view of an electronic device according to Third Embodiment.

An electronic device ED-DF has a semiconductor device IC, a semiconductor device IC-B, and a mounting board MB-DF. The semiconductor devices IC and IC-B are similar to those shown in FIGS. 8A and 8B. The electronic device ED-DF has a symmetric structure with respect to a dotted line B-B'. The mounting board MB-DF has, in addition to the mounting board MB of FIGS. 8A and 8B, a pad PD-B.

In FIG. 19, some symbols are attached with "- (hyphen)" or "B (capital B)". Constituting elements with these symbols are symmetrical with constituent elements without "- hyphen" or "B (capital B)" with respect to the dotted line B-B' and they correspond to each other. As one example, a second lead LF2 and a second lead LF2-B correspond to each other and are symmetrical with respect to the dotted line B-B'. Similarly, a second coupling member AL2-I and a second coupling member AL2-IB correspond to each other and are symmetrical with respect to the dotted line B-B'. In Third Embodiment, materials of the constituent elements of the electronic device ED-DF are similar to those of the electronic device ED according to First Embodiment.

Supposing that, in a portion of the electronic device above the dotted line B-B', a temperature cycling test is made on the second coupling member AL2-I as in the test of the second coupling member AL2, the test may cause a force in the semiconductor device IC by which the die pad DP is bent to become wider than the semiconductor package member PKG as shown in FIGS. 1A to 1D. Similarly, supposing that, in a portion of the electronic device ED-DF according to Third Embodiment below the dotted line B-B', a temperature cycling test is made on the second coupling member AL2-IB as in the test of the second coupling member AL2, the test may cause a force in the semiconductor device IC-B by which the die pad DP-B is bent to become wider than the semiconductor package member PKG-B by reference to FIGS. 1A to 1D. These bending forces work so as to cancel the warping forces each other. By these forces so as to cancel the warping forces, the force in the semiconductor device IC by which the die pad DP is bent to become wider than the semiconductor package member PKG is cancelled and the force in the semiconductor device IC-B by which the die pad DP-B is bent to become wider than the semiconductor package member PKG-B is cancelled. As a result, a stress to be applied to the first coupling member AL1 or AL1-B in the vicinity of the chip edge of the semiconductor device IC or semiconductor device IC-B is not relaxed and damages (troubles) such as cracks occur in the first coupling member AL1 or AL1-B due to temperature cycling, leading to separation between the semiconductor chip and the die pad.

Such troubles occur even when the flexural rigidity $K_{IC}$ of the semiconductor device IC or IC-B is not smaller than the flexural rigidity $K_{MB}$ of the mounting board MB-DF, because a stress to be applied to the first coupling member AL1 or AL1-B in the vicinity of the chip edge CE of the semiconductor device IC or the semiconductor device IC-B is not relaxed due to the above-mentioned forces to cancel the respective warping forces. Irrespective of the flexural rigidity $K_{MB}$ of the mounting board MB-DF, it is necessary for the second coupling member AL2-I or AL2-IB not to permit the mounting board MB to completely disturb deformation of the semiconductor device IC or IC-B in the case of the electronic device ED-DF with line-symmetrically mounted semiconductor devices.

Thus, by making use of the force by which the die pad DP is bent to become wider than the semiconductor package member PKG or the force by which the die pad DP-B is bent to become wider than the semiconductor package member PKG-B, a stress to be applied to the first coupling member AL1 or AL1-B in the vicinity of the chip edge of the semiconductor device IC or the semiconductor device IC-B is relaxed. This makes it possible to reduce damages of the first coupling member AL1 or AL1-B such as cracks due to temperature cycling and reduce separation between the semiconductor chip CP and the die pad DP.

Such a problem occurs not only in a line-symmetrical mounting mode but also when an electronic part such as semiconductor device different from the semiconductor device IC-B or another part has been mounted on the back surface of the mounting board MB. This means that an effect similar to that of Third Embodiment is produced when the semiconductor device according to Second Embodiment is mounted on the back surface of the mounting board MB or the semiconductor device IC-B is not mounted on the mounting board MB.

In FIG. 19, the plane area of a portion of the second coupling member AL2-I or AL2-IB in contact with the pad PD or PD-B is smaller than the plane area of the pad PD or PD-B, but it is more preferred to make the plane area of the portion of the second coupling member AL2-I or AL2-IB in contact with the pad PD or PD-B equal to the plane area of the pad PD or PD-B. In other words, it is more preferred that the area of the upper surface of the pad PD or PD-B is made smaller than the area of the back surface of the die pad DP or DP-B.

Fourth Embodiment

Figure 20:
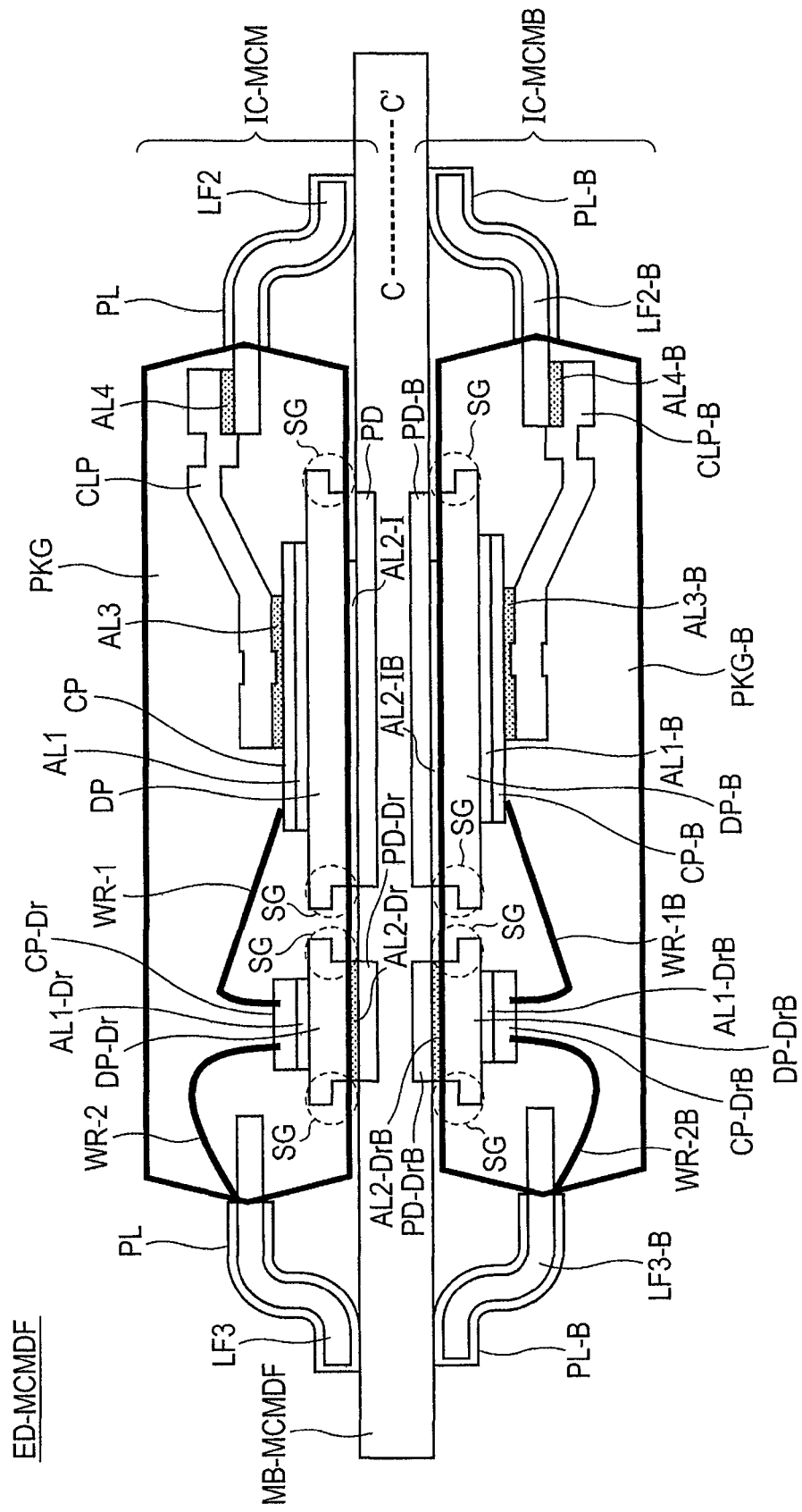
FIG. 20 is a cross-sectional view of an electronic device according to Fourth Embodiment.

FIG. 20 is a cross-sectional view of an electronic device according to Fourth Embodiment.

An electronic device ED-MCMDF shown in FIG. 20 has a semiconductor device IC-MCM, a semiconductor device IC-MCMB, and a mounting board MB-MCMDF. The semiconductor device IC-MCM is similar to that shown in FIG. 14. The electronic device ED-MCMDF has a structure symmetrical with respect to a dotted line C-C'. The mounting board MB-MCMDF has, in addition to the mounting board MB-MCM shown in FIG. 14, a pad PD-B and a driver pad PD-DrB.

In FIG. 20, some symbols are attached with "- (hyphen)" or "B (capital B)". Constituting elements with these symbols are symmetrical with constituent elements without "- hyphen" or "B (capital B)" with respect to the dotted line C-C' and they correspond to each other. As one example, a second lead LF2 and a second lead LF2-B correspond to each other and are symmetrical with respect to the dotted line C-C'. Similarly, a driver second coupling member AL2-Dr and a driver second coupling member AL2-DrB correspond to each other and are symmetrical with respect to the dotted line C-C'. Similarly, the semiconductor device IC-MCM and the semiconductor device IC-MCMB correspond to each other and are symmetrical with respect to the dotted line C-C'.

In Fourth Embodiment, materials of the constituent elements of the electronic device ED-MCMDF are similar to those of the electronic device ED-MCM according to Second Embodiment.

The electronic device ED-MCMDF according to Fourth Embodiment is also similar to the electronic device ED-DF according to Third Embodiment. In the case of the electronic device MCMDF in which semiconductor devices have been line-symmetrically mounted, irrespective of the flexural rigidity $K_{MB}$ of the mounting board MB-MCMDF, it is necessary for the second coupling member AL2-I or AL2-IB not to permit the mounting board MB-MCMDF to completely disturb the deformation of the semiconductor device IC-MCM or IC-MCMB. Thus, by making use of the force by which the die pad DP is bent to become wider than the semiconductor package member PKG or the force by which the die pad DP-B is bent to become wider than the semiconductor package member PKG-B, a stress to be applied to the first coupling member AL1 or AL1-B in the vicinity of the chip edge of the semiconductor device IC-MCM or semiconductor device IC-MCMB is relaxed. This makes it possible to reduce damages of the first coupling member AL1 or AL1-B such as cracks due to temperature cycling and reduce separation between the semiconductor chip CP and the die pad DP.

Such a problem occurs not only in a line-symmetrical mounting mode but also when an electronic part such as a semiconductor device different from the semiconductor device IC-MCMB or another part has been mounted on the back surface of the mounting board MB. This means that an effect similar to that of Fourth Embodiment is produced when the semiconductor device IC-MCMB is not mounted on the mounting board MB.

In FIG. 20, the plane area of a portion of the second coupling member AL2-I or AL2-IB in contact with the pad PD or PD-B is smaller than the plane area of the pad PD or PD-B, but it is more preferred to make the plane area of a portion of the second coupling member AL2-I or AL2-IB in contact with the pad PD or PD-B equal to the plane area of the pad PD or PD-B. In other words, the area of the upper surface of the pad PD or PD-B is made smaller than the area of the back surface of the die pad DP or DP-B.

The present invention has so far been described specifically based on some embodiments. It is to be noted that the present invention is not limited to them but needless to say, it can be modified in various ways without departing from the scope of the invention.

For example, it has been described in the embodiments that the number of each of a semiconductor chip with a power MOSFET and a die pad is one. The invention can be applied not only to it but also to an electronic device in which two semiconductor chips with a power MOSFET are mounted on respective die pads. This means that the present invention can be applied to an electronic device with two die pads. In this case, second leads may be divided and some are used for a first semiconductor chip and the others for a second semiconductor chip.

In the embodiments, a description has been made with power MOSFET as an example of a power transistor. The invention can be applied not only to the power MOSFET but also to a bipolar transistor.

What is claimed is:
1. An electronic device comprising:
a mounting board having, over a first surface thereof, a first pad; and
a semiconductor device,
the semiconductor device comprising a first die pad, a first semiconductor chip placed over the upper surface of the first die pad, a first coupling member coupling the first die pad to the first semiconductor chip, and a semiconductor package member covering the upper surface of the first semiconductor chip, the side surface of the first semiconductor chip, and the side surface of the first die pad,
wherein the first die pad has a lower surface on the side opposite to the upper surface and the lower surface has a first region exposed from the semiconductor package member,
wherein the first pad and the lower surface of the first die pad are coupled to each other with a second coupling,
wherein the first region has an area greater than an area, in a plan view, of a portion of the second coupling member to be brought into contact with the first region,
wherein the area of the first region is greater than an area, in a plan view, of the semiconductor chip,
wherein the semiconductor package member has a linear expansion coefficient less than a linear expansion coefficient of the die pad, and
wherein the plane area of the first pad is less than the area of the first region and is substantially equal to the area of the second coupling member in a plan view.
2. The electronic device according to claim 1,
wherein the semiconductor package material has a glass transition temperature from 150 to 180° C. and at an area where the temperature of the semiconductor package member is greater than the glass transition temperature, the semiconductor package member has a linear expansion coefficient greater than a linear expansion coefficient of the die pad.
3. The electronic device according to claim 1,
wherein in a plan view, the second coupling member is disposed within the first coupling member.
4. The electronic device according to claim 1,
wherein the first region has an area less than twice the area of the second coupling member in a plan view.
5. The electronic device according to claim 1,
wherein the semiconductor chip comprises a power MOSFET, a source pad and a gate pad of the power MOSFET over the upper surface of the semiconductor chip, and a drain pad of the power MOSFET over a lower surface of the semiconductor chip which is on the side opposite to the upper surface,
wherein the drain pad is coupled to the first coupling member, and
wherein the first coupling member, the die pad, and the second coupling member are conductive.
6. The electronic device according to claim 5,
wherein the semiconductor device comprises:
a source lead having a plurality of leads equipped with a first plate portion and a second plate portion, a portion of each of the leads being exposed from the semiconductor package member and the second plate portion and the first plate portion being coupled to each other inside the semiconductor package member, and
a metal plate coupled to the source pad and the source lead, and
wherein in a plan view, the source lead and the second coupling member have therebetween a second region which is a portion of the first region of the lower surface of the first die pad exposed from the semiconductor package member.

7. The electronic device according to claim 6, further comprising a plurality of third leads, a plurality of first wires, and a plurality of second wires,
wherein the semiconductor device comprises a second die pad, a second semiconductor chip placed over the upper surface of the second die pad, and a third coupling member coupling the second die pad and the second semiconductor chip,
wherein the second semiconductor chip is a driver IC driving and controlling the power MOSFET,
wherein the second package member covers therewith the upper surface of the second semiconductor chip, the second die pad, and the side surface of the second semiconductor chip,
wherein the semiconductor package member has, in a plan view, a rectangular shape formed with a first side, a second side, a third side opposite to the first side, and a fourth side opposite to the second side,
wherein the third leads are placed along the first side and a portion of each of the third leads is exposed from the semiconductor package member,
wherein the leads are placed along the third side,
wherein the second semiconductor chip and each of the third leads are coupled to each other with each of the first wires,
wherein the second semiconductor chip and the first semiconductor are coupled to each other with each of the second wires, and
wherein a gate drive signal output terminal of the second semiconductor chip and the gate terminal are coupled to each other with some of the second wires.

8. The electronic device according to claim 7,
wherein the metal plate is made of any of copper, a copper alloy, aluminum, and an aluminum alloy,
wherein the first and second wires are made of any of gold, copper, and aluminum, and
wherein the third leads and the source lead are made of copper or a copper alloy.

9. The electronic device according to claim 1,
wherein the semiconductor package member is made of a thermosetting resin material such as an epoxy resin or biphenyl resin containing any of a filler, a phenol curing agent, and a silicone rubber,
wherein the die pad is made of copper or a copper alloy;
wherein the first coupling member and the second coupling member are each made of a silver paste or a solder, and
wherein the mounting board has an epoxy resin.

10. An electronic device, comprising:
a mounting board having a first surface; and
a first semiconductor device mounted over the first surface of the mounting board,
the first semiconductor device comprising a first die pad, a first semiconductor chip placed over the upper surface of the first die pad, a first coupling member coupling the first die pad to the first semiconductor chip, and a semiconductor package member covering the upper surface of the first semiconductor chip, the side surface of the first chip, and the side surface of the first die pad,
wherein the first die pad has, over the lower surface thereof opposite to the upper surface, a first region exposed from the semiconductor package member,
wherein a first pad of the first surface of the mounting board and the lower surface of the first die pad are coupled to each other with a second coupling member,
wherein the first region has an area greater than the area of a portion, in a plan view, of the second coupling member in contact with the first region,
wherein a second semiconductor device, having the same configuration as that of the first semiconductor device, is line-symmetrically mounted over a second surface of the mounting board opposite to the first surface,
wherein the area of the first region is greater than an area, in a plan view, of the first semiconductor chip,
wherein the semiconductor package member has a linear expansion coefficient less than a linear expansion coefficient of the first die pad, and
wherein the plane area of the first pad is less than the area of the first region and is substantially equal to the area of the second coupling member in a plan view.

11. The electronic device according to claim 10,
wherein the first region has an area greater than the area of the first pad.

12. The electronic device according to claim 1,
wherein the mounting board has a flexural rigidity greater than that of the semiconductor device.

13. An electronic device, comprising:
a mounting board having a pad; and
a semiconductor device,
the semiconductor device comprising a die pad, a semiconductor chip placed over the upper surface of the die pad, a first coupling member coupling the die pad to the semiconductor chip, and a molding body covering the upper surface of the semiconductor chip, the side surface of the semiconductor chip, and the side surface of the die pad,
wherein the die pad has, over the lower surface thereof opposite to the upper surface, a first region exposed from the molding body,
wherein the pad and the lower surface of the die pad are coupled to each other with a second coupling member,
wherein the first region has an area greater than the area of the pad,
wherein the area of the first region is greater than an area, in a plan view, of the semiconductor chip,
wherein the semiconductor package member has a linear expansion coefficient less than a linear expansion coefficient of the die pad, and
wherein the plane area of the pad is less than the area of the first region and is substantially equal to the area of the second coupling member in a plan view.

14. A semiconductor device to be mounted over a mounting board having a pad, comprising:
a die pad to be coupled to the pad, a semiconductor chip placed over the upper surface of the die pad, a first coupling member coupling the die pad to the semiconductor chip, and a molding body covering the upper surface of the semiconductor chip, the side surface of the semiconductor chip, and the side surface of the die pad,
wherein the die pad has, over the lower surface thereof opposite to the upper surface, a first region exposed from the molding body,
wherein the first region has an area greater than the area of the semiconductor chip,
wherein the first region has an area greater than the area of the pad,
wherein the pad and the lower surface of the die pad are coupled to each other with a second coupling,
wherein the semiconductor package member has a linear expansion coefficient less than a linear expansion coefficient of the die pad, and wherein the plane area of the pad is less than the area of the first region and is substantially equal to the area of the second coupling member in a plan view.

15. The semiconductor device according to claim 14, further comprising:
- a plurality of first leads exposed from one of the side surfaces of the molding body; and
- a plurality of second leads exposed from the other side surface opposite to the one of the side surfaces of the molding body, wherein the second leads each have a width greater than the width of each of the first leads.

16. The semiconductor device according to claim 15, further comprising a metal plate coupling the upper surface of the semiconductor chip to the second leads.

17. The semiconductor device according to claim 16,
wherein the semiconductor chip comprises a power MOSFET having a drain pad, a source pad, and a gate pad, and
wherein the drain pad is coupled to the die pad, the source pad is coupled to the metal plate, and the gate pad is coupled to a bonding wire.

* * * * *